(12) United States Patent
Akita et al.

(10) Patent No.: US 8,704,522 B2
(45) Date of Patent: Apr. 22, 2014

(54) MAGNETIC RESONANCE IMAGING APPARATUS INCLUDING ELEMENTS FOR PHASE CORRECTION OF WIRELESS TRANSMISSIONS

(75) Inventors: Koji Akita, Yokohama (JP); Takahiro Sekiguchi, Yokohama (JP); Toshiyuki Nakanishi, Yokohama (JP); Kazuya Okamoto, Saitama (JP); Sojuro Kato, Nasushiobara (JP)

(73) Assignees: Kabushiki Kaisha Toshiba, Minato-ku, Tokyo (JP); Toshiba Medical Systems Corporation, Otawara-shi, Tochigi (JP)

( * ) Notice: Subject to any disclaimer, the term of this patent is extended or adjusted under 35 U.S.C. 154(b) by 402 days.

(21) Appl. No.: 13/048,343

(22) Filed: Mar. 15, 2011

(65) Prior Publication Data

US 2011/0227574 A1  Sep. 22, 2011

(30) Foreign Application Priority Data

Mar. 18, 2010  (JP) ................................. 2010-063106

(51) Int. Cl.
*G01R 33/20* (2006.01)
(52) U.S. Cl.
USPC .......................................... 324/322; 324/318
(58) Field of Classification Search
USPC ........................................................ 324/322
See application file for complete search history.

(56) References Cited

U.S. PATENT DOCUMENTS

| 5,384,536 | A | 1/1995 | Murakami et al. ............. 324/309 |
| 8,174,264 | B2 * | 5/2012 | Adachi et al. ................. 324/318 |
| 2006/0244452 | A1 * | 11/2006 | Den Boef ...................... 324/322 |
| 2009/0322335 | A1 * | 12/2009 | Adachi et al. ................. 324/318 |
| 2010/0117649 | A1 * | 5/2010 | Nakanishi et al. ............ 324/318 |
| 2010/0259261 | A1 * | 10/2010 | Saes et al. ..................... 324/309 |

FOREIGN PATENT DOCUMENTS

WO  2008/155703 A1  12/2008

OTHER PUBLICATIONS

Sekiguchi et al., "Development of Digital Wireless Transceiver for a MRI Coil with Clock Synchronization", 2009, ISMRM, 17th Scientific Meeting, p. 3068.*
Third Japanese Office Action dated Oct. 15, 2013 from JP 201110048479.2, 14 pages.

* cited by examiner

*Primary Examiner* — Melissa Koval
*Assistant Examiner* — Rishi Patel
(74) *Attorney, Agent, or Firm* — Ohlandt, Greeley, Ruggiero & Perle, L.L.P.

(57) ABSTRACT

In one embodiment, an MRI apparatus includes first and second clock generators, a pulse generator, transmission and reception coils, pulse and phase detectors, and a corrector. The pulse generator generates an excitation pulse signal based on a clock signal generated by the first clock generator. The reception coil outputs a radio frequency signals corresponding to an excitation pulse transmitted from the transmission coil or an MR echo. The converter digitizes, synchronously with a clock signal generated by the second clock generator, the radio frequency signal, to obtain radio frequency data. The pulse detector detects excitation pulse data corresponding to the excitation pulse from the radio frequency data. The phase detector detects a phase of a pulse indicated by the detected excitation pulse data. The corrector corrects the radio frequency data based on the detected phase, to compensate for a phase offset which occurs in the echo during the digitization.

20 Claims, 22 Drawing Sheets

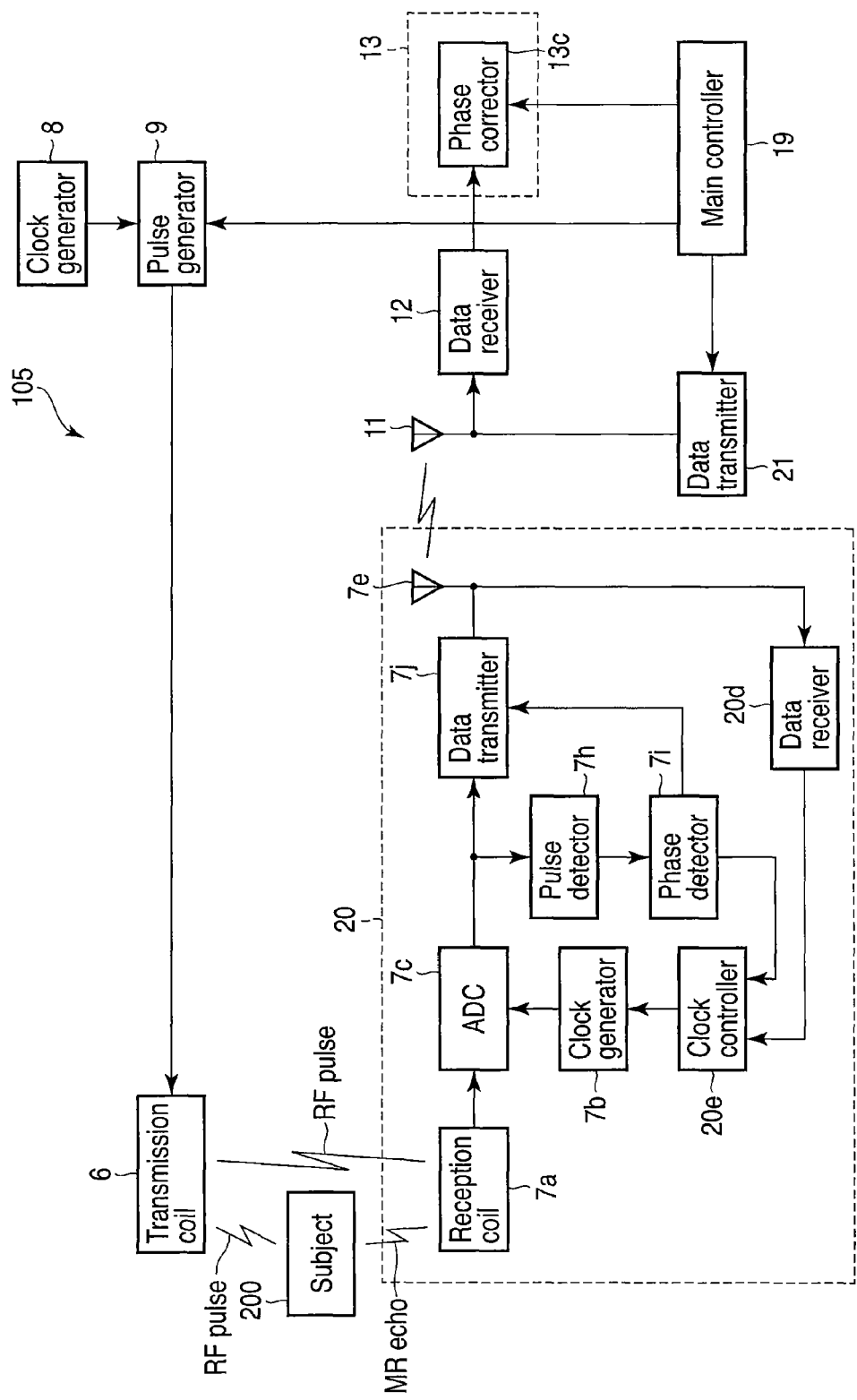
F I G. 13

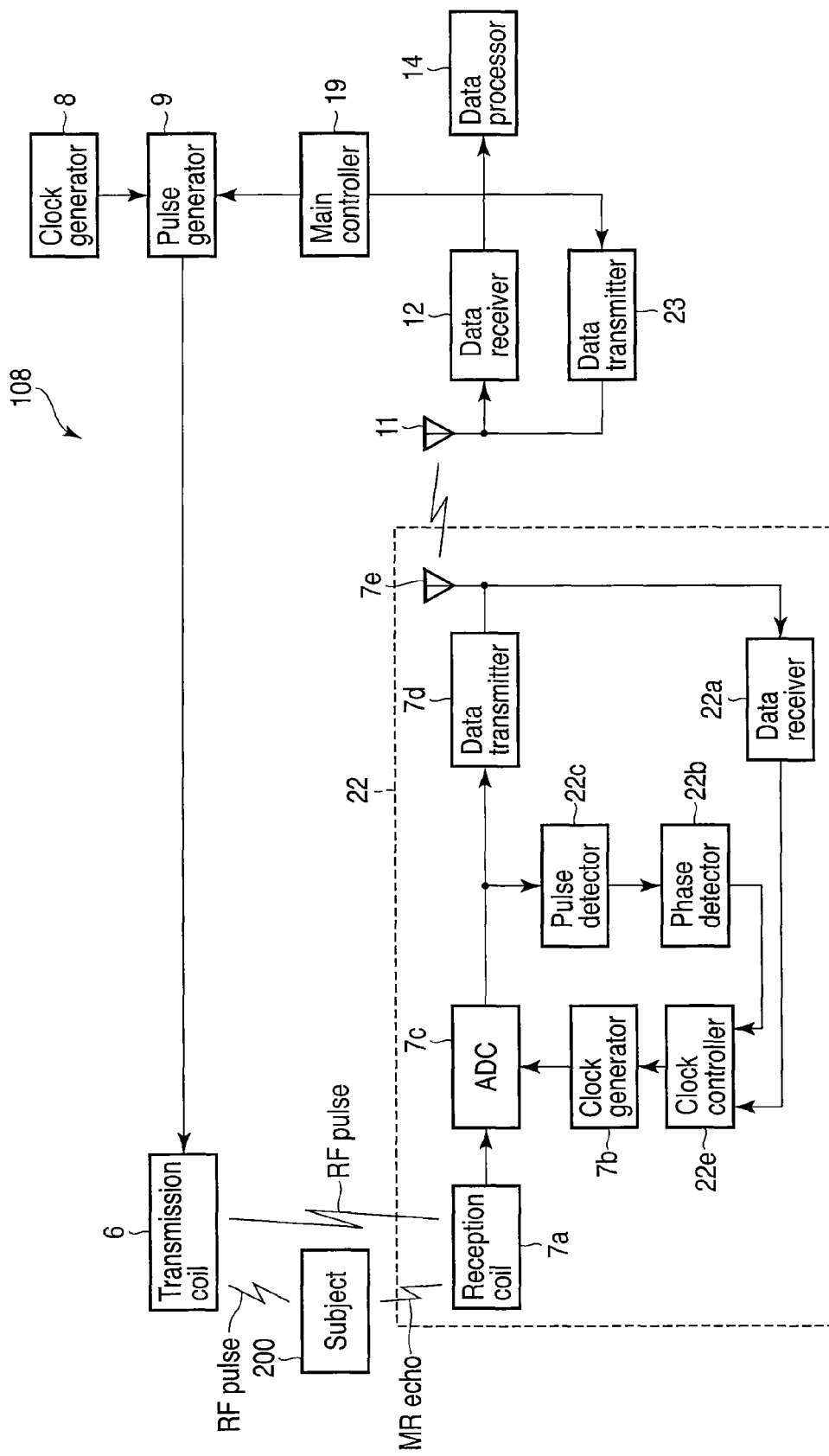
F I G. 17

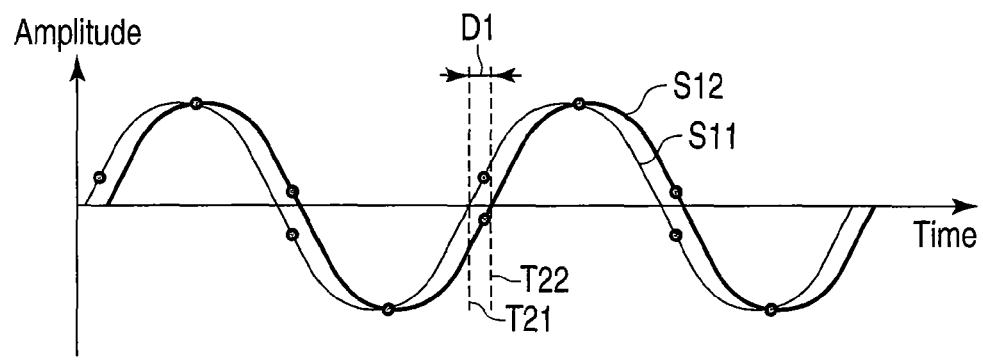
F I G. 2 4
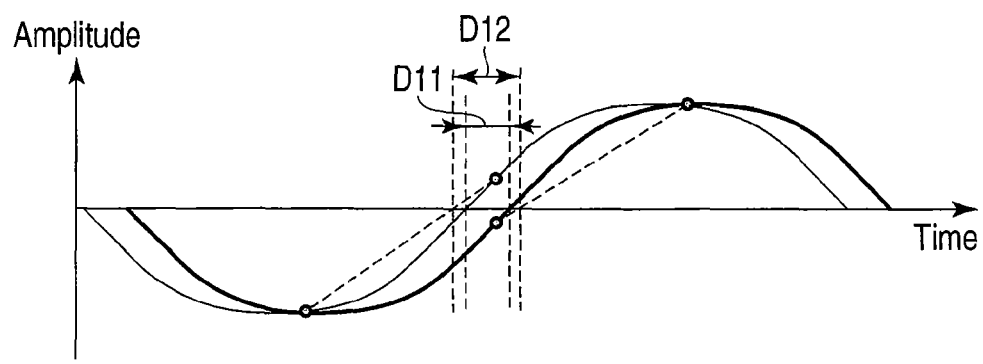
F I G. 2 5

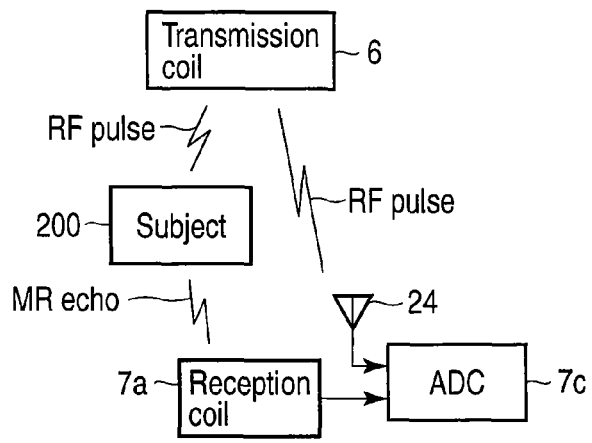
F I G. 2 6
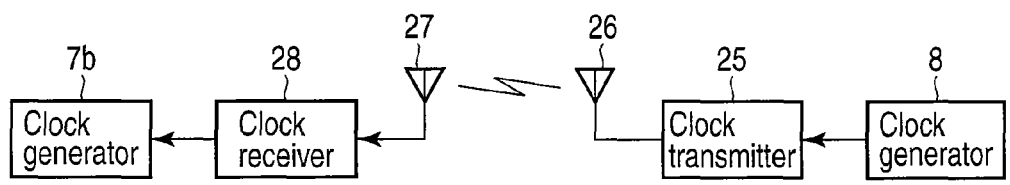
F I G. 2 7

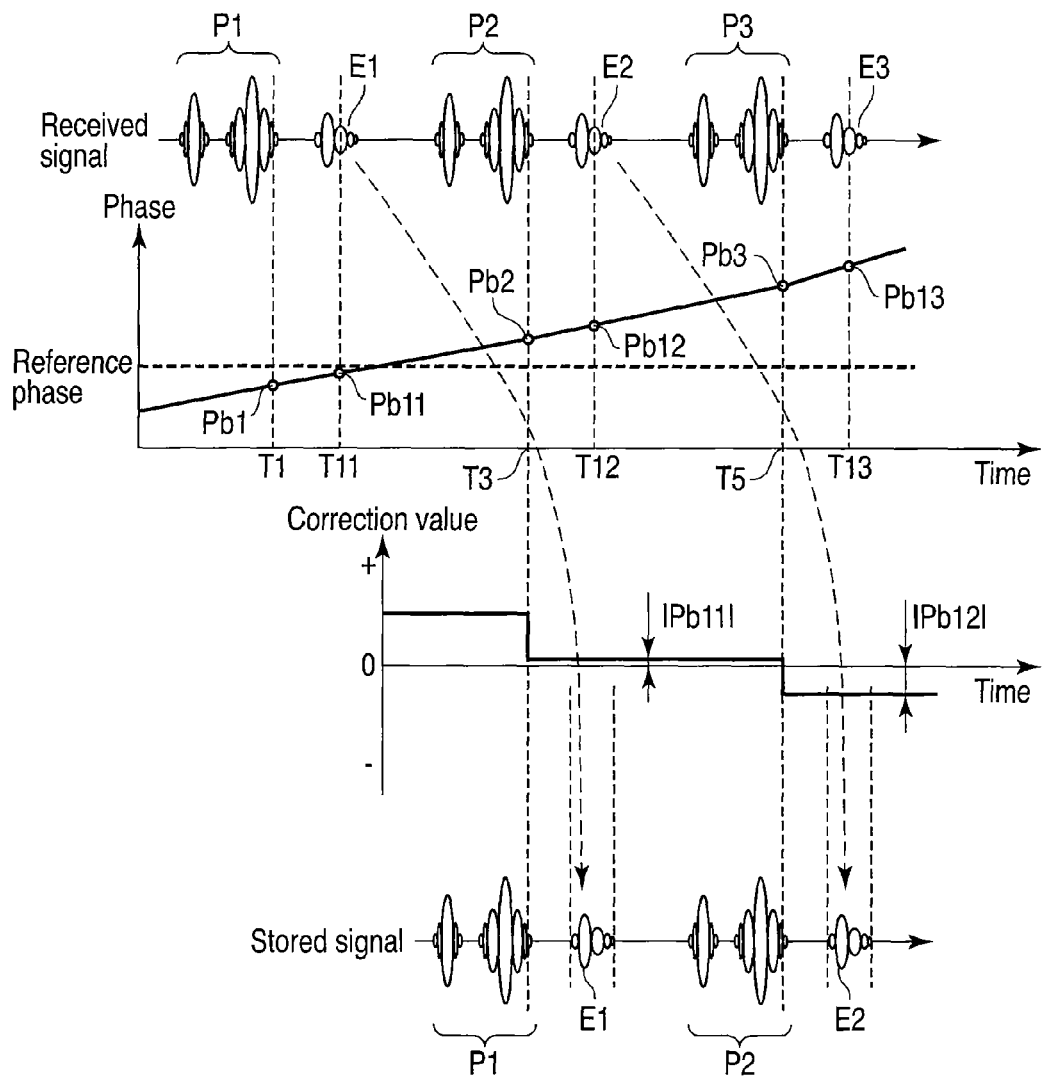
F I G. 29

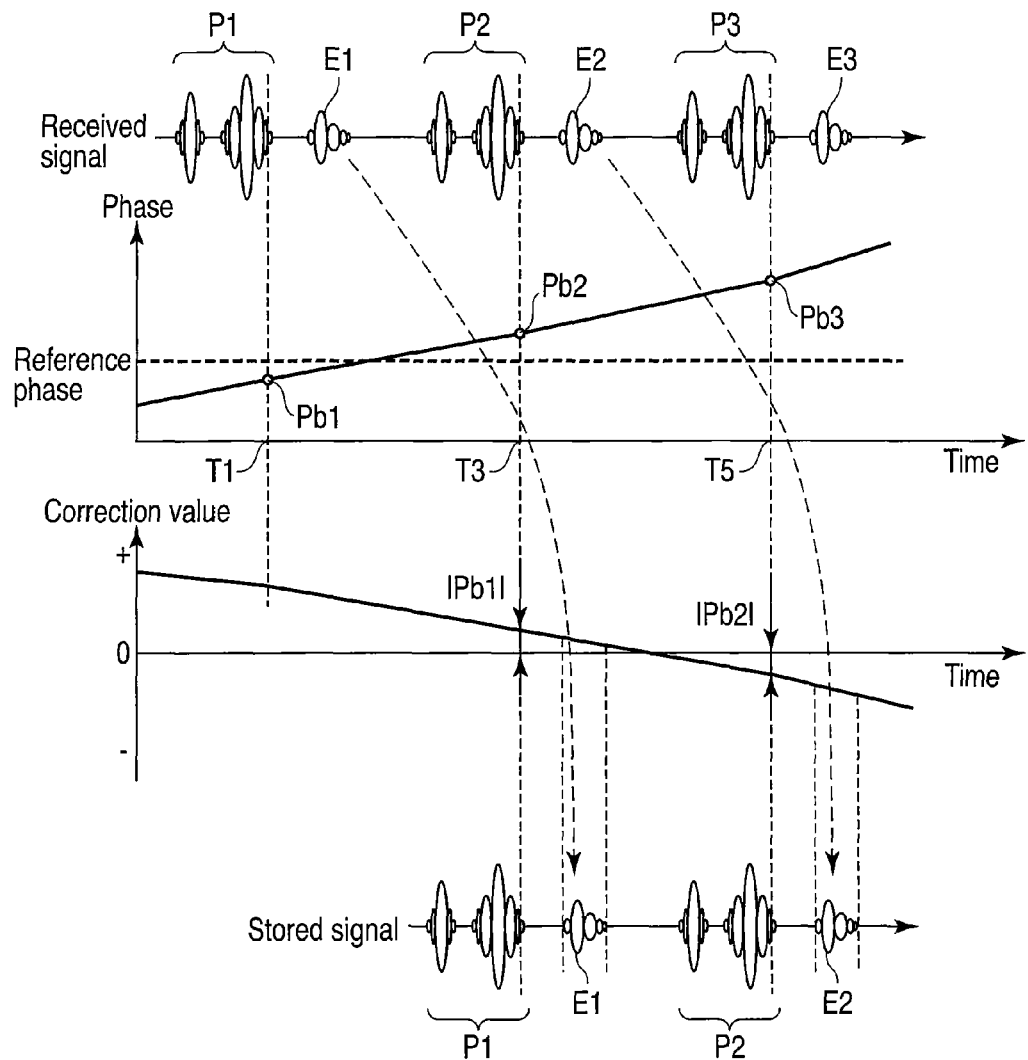
F I G. 3 0

MAGNETIC RESONANCE IMAGING APPARATUS INCLUDING ELEMENTS FOR PHASE CORRECTION OF WIRELESS TRANSMISSIONS

CROSS-REFERENCE TO RELATED APPLICATIONS

This application is based upon and claims the benefit of priority from Japanese Patent Application No. 2010-063106, filed Mar. 18, 2010; the entire contents of which are incorporated herein by reference.

FIELD

Embodiments described herein relate generally to a magnetic resonance imaging apparatus.

BACKGROUND

A magnetic resonance imaging apparatus (the MRI apparatus) is an apparatus for observing an echo signal (the MR echo signal) emitted from a subject after an RF pulse is emitted to the subject, to obtain a sectional image of the subject. In general, the MRI apparatus requires a plurality of echo signals to obtain one image. When frequencies and phases of the echo signals are analyzed, the sectional image can be obtained. Therefore, in acquiring these echo signals, respective frequencies of the emitted RF pulses need to be constant. For the emission of the RF pulses, a transmission coil is used, and for the reception of the echo signals, a reception coil is used.

A digital signal obtained by digitalizing the echo signal received through the reception coil in an analog-digital converter (ADC) is wirelessly transmitted, whereby the reception coil is made to be wireless. This system is known by U.S. Pat. No. 5,384,536 (hereinafter referred to as Reference 1).

When the echo signal is digitalized in this manner, a frequency of a clock signal which is used to drive the ADC (hereinafter referred to as the second clock signal) needs to match a frequency of a clock signal which is used to generate the RF pulse (hereinafter referred to as the first clock signal). When these frequencies of the first and second clock signals are different from each other, the phase of the digitalized echo signal change according to time, and accuracy of the sectional image reconstructed from this echo signal deteriorates.

In Reference 1, the first clock signal is wirelessly transmitted as a reference signal, and on the basis of this reference signal, the second clock signal is generated.

In a case where the system of Reference 1 is used and the reference signal is transmitted without any deterioration, the second clock signal can accurately be synchronized with the first clock signal. However, usually in the wireless transmission, noises are added to a transmission signal passed through various apparatuses for the wireless transmission. Moreover, during the wireless transmission, the transmission signal is distorted owing to multipath phasing or Doppler shift. In consequence, it is difficult to wirelessly transmit the reference signal without any deterioration, and the frequency of the second clock signal generated on the basis of the deteriorated reference signal might be different from that of the first clock signal.

From such a situation, it has been desired to suppress accuracy deterioration of the sectional image due to influence of the phase shift which occurs in the magnetic resonance echo signal during the digitalization of the magnetic resonance echo signal.

BRIEF DESCRIPTION OF THE DRAWINGS

FIG. 13 is a block diagram of a correction unit and a coil side unit in an MRI apparatus according to a fifth embodiment;

FIG. 17 is a block diagram of a coil side unit in an MRI apparatus according to an eighth embodiment;

FIG. 24 is a diagram showing a principle for detecting a phase of the RF pulse signal;

FIG. 25 is a diagram showing another principle for detecting the phase of the RF pulse signal;

FIG. 26 is a block diagram showing a modification example of the first to ninth embodiments;

FIG. 27 is a block diagram showing another modification example of the first to ninth embodiments;

FIG. 29 is a diagram showing an example of change of a correction value set in a fifth correction processing example; and FIG. 30 is a diagram showing an example of change of a correction value set in a sixth correction processing example.

DETAILED DESCRIPTION

In general, according to one embodiment, a magnetic resonance imaging apparatus includes a first clock generator, a pulse generator, a transmission coil, a reception coil, a second clock generator, a pulse detector, and a corrector. The first clock generator generates a first clock signal. The pulse generator generates an excitation pulse signal based on the first clock signal. The transmission coil wirelessly transmits an excitation pulse based on the excitation pulse signal. The reception coil, when the excitation pulse wirelessly transmitted from the transmission coil comes, outputs a radio frequency signal corresponding to the excitation pulse, and when magnetic resonance echo emitted from a subject by a function of the excitation pulse comes, outputs a radio frequency signal corresponding to the magnetic resonance echo. The second clock generator generates a second clock signal. The digital converter digitizes, synchronously with the second clock signal, the radio frequency signal or signal obtained by subjecting the radio frequency signal to predetermined processing, to obtain radio frequency data. The pulse detector detects excitation pulse data corresponding to the excitation pulse from the radio frequency data. The phase detector detects a phase of a pulse indicated by the excitation pulse data detected by the pulse detector. The corrector corrects the radio frequency data based on the phase detected by the phase detector, to compensate for a phase shift which occurs in the magnetic resonance echo during the digitization in the digital converter.

Hereinafter, embodiments will be described with reference to the drawings.

First Embodiment

Figure 1:
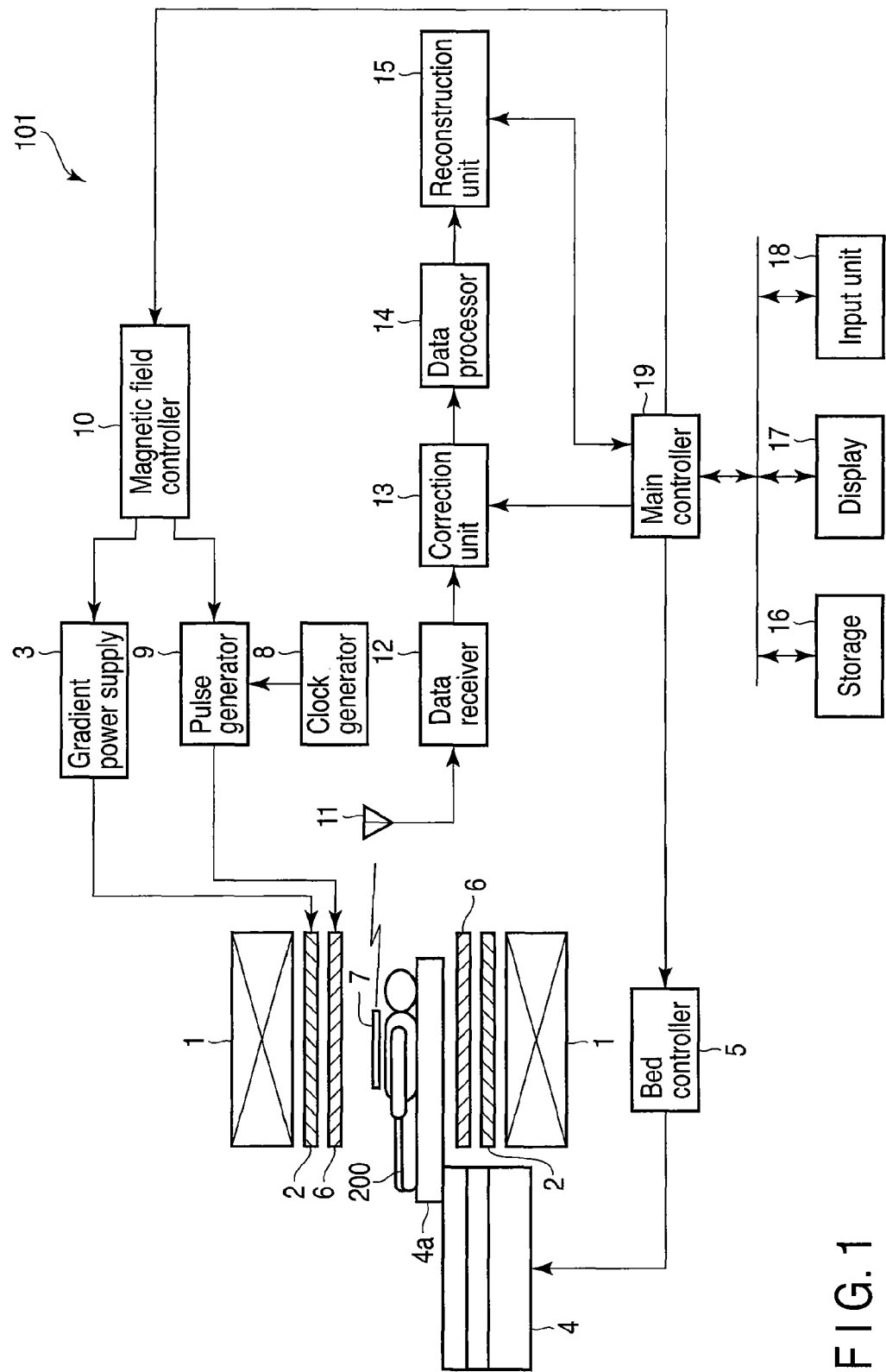
FIG. 1 is a diagram showing a constitution of an MRI apparatus according to a first embodiment.

FIG. 1 is a diagram showing a constitution of an MRI apparatus 101 according to a first embodiment.

The MRI apparatus 101 comprises a static magnet 1, a gradient coil 2, a gradient power supply 3, a bed 4, a bed controller 5, a transmission coil unit 6, a coil side unit 7, a clock generator 8, a pulse generator 9, a magnetic field controller 10, an antenna 11, a data receiver 12, a correction unit 13, a data processor 14, a reconstruction unit 15, a storage 16, a display 17, an input unit 18, and a main controller 19. It is to be noted that among these units, the units other than the coil side unit 7 are disposed in a system side unit which is disposed separately from the coil side unit 7. It is to be noted that the system side unit is divided into a gantry and a processing unit sometimes in a certain case. In this case, for example, the static magnet 1, the gradient coil 2, the gradient power supply 3, the bed 4, the bed controller 5, the transmission coil unit 6, the pulse generator 9, the magnetic field controller 10, the antenna 11 and the data receiver 12 are disposed in the gantry, and the clock generator 8, the correction unit 13, the data processor 14, the reconstruction unit 15, the storage 16, the display 17, the input unit 18 and the main controller 19 are disposed in the processing unit.

The static magnet 1 has a hollow cylindrical shape, and generates a uniform static magnetic field in an internal space thereof. As the static magnet 1, for example, a permanent magnet or a superconducting magnet is used.

The gradient coil 2 has a hollow cylindrical shape, and is disposed inside the static magnet 1. The gradient coil 2 is obtained by combining three types of coils corresponding to mutually orthogonal X, Y and Z-axes. In the gradient coil 2, the above three types of coils individually receive a current supplied from the gradient power supply 3, to generate a gradient magnetic field which slants along the respective X, Y and Z-axes. It is to be noted that, for example, a Z-axis direction is the same as a static magnetic direction. The gradient magnetic fields of the respective X, Y and Z-axes correspond to, for example, a gradient magnetic field Gs for slice selection, a gradient magnetic field Ge for phase encoding and a gradient magnetic field Gr for read-out, respectively. The gradient magnetic field Gs arbitrarily determines an imaging section. The gradient magnetic field Ge changes the phase of a magnetic resonance signal in accordance with a spatial position. The gradient magnetic field Gr changes the frequency of the magnetic resonance signal in accordance with the spatial position.

A top plate 4a of the bed 4 is moved in a longitudinal direction (a right-left direction in FIG. 1) and vertical direction thereof under the control of the bed controller 5. The bed 4 is usually installed so that the longitudinal direction thereof is parallel to the central axis of the static magnet 1. A subject 200 is mounted on the top plate 4a. The top plate 4a of the bed 4 is moved to insert the subject 200 into the internal space (an imaging space) of the gradient coil 2.

The transmission coil unit 6 has a constitution in which one or a plurality of coils are disposed in a cylindrical case. The transmission coil unit 6 is disposed inside the gradient coil 2. The transmission coil unit 6 receives an RF pulse signal supplied from the pulse generator 9, to emit an RF pulse.

The coil side unit 7 is mounted on the top plate 4a, built in the top plate 4a, or attached to the subject 200. Moreover, during imaging, the coil side unit, together with the subject 200, is inserted into the imaging space, and receives an electromagnetic wave including magnetic resonance echo (MR echo) emitted from the subject 200 and the RF pulse emitted from the transmission coil unit 6, to obtain an electric RF signal. This RF signal includes a magnetic resonance echo signal indicating the magnetic resonance echo (hereinafter referred to as the echo signal) and the RF pulse signal indicating the RF pulse. The coil side unit 7 wirelessly transmits a signal for transmission including radio frequency data (RF data) obtained by digitalizing the RF signal.

The clock generator 8 generates a first clock signal having a predetermined frequency. This first clock signal may be used as a system clock which is a reference of the operation timing of the whole MRI apparatus 101.

The pulse generator 9 generates the RF pulse signal synchronously with the first clock signal.

The magnetic field controller 10 controls the gradient power supply 3 so as to change each gradient magnetic field in accordance with a required pulse sequence under the control of the main controller 19. Moreover, the magnetic field controller controls the pulse generator 9 so as to generate the RF pulse in accordance with a parameter set by the main controller 19 (hereinafter referred to as the RF parameter). It is to be noted that the RF parameter indicates the emission timing, phase, power, signal waveform and the like of the RF pulse.

The antenna 11 receives the electromagnetic wave emitted from the coil side unit 7, to obtain the signal for transmission.

The data receiver 12 extracts the RF data from the signal for transmission obtained by the antenna 11. Specifically, the data receiver 12 subjects the signal for transmission to amplification, demodulation, decoding and the like. That is, the data receiver 12 amplifies the signal for transmission up to a level which is suitable for the subsequent processing. Next, the data receiver 12 detects the amplified signal for transmission to extract the RF data having a coded state. Furthermore, the data receiver 12 decodes the extracted RF data which has been coded for digital transmission, to obtain the original RF data.

The correction unit 13 corrects the RF data so as to compensate for a phase shift which occurs in the echo signal indicated by a part of the RF data.

The data processor 14 subjects the RF data corrected by the correction unit 13 to gain control, frequency conversion and perpendicular wave detection.

The reconstruction unit 15 reconstructs an image concerning the subject 200 based on the RF data processed by the data processor 14.

The storage 16 stores various types of data such as image data indicating the image reconstructed by the reconstruction unit 15.

The display 17 displays the image reconstructed by the reconstruction unit 15, or various types of information of various types of operation screens for operating the MRI apparatus 101 by a user, under the control of the main controller 19. As the display 17, a display device such as a liquid crystal display can be utilized.

The input unit 18 accepts various types of commands or information inputs from the operator. As the input unit 18, there can appropriately be utilized a pointing device such as a mouse or a track ball, a selection device such as a mode changeover switch, or an input device such as a keyboard.

The main controller 19 includes a CPU, a memory and the like (not shown), and generally controls the MRI apparatus 101. The main controller 19 has a function of setting an emission timing, phase, power, signal waveform and the like of the RF pulse adapted to imaging conditions determined based on an operator's operation or the like, and a function of generating RF parameters indicating these conditions to transfer the parameters to the pulse generator 9 and the correction unit 13.

Figure 2:
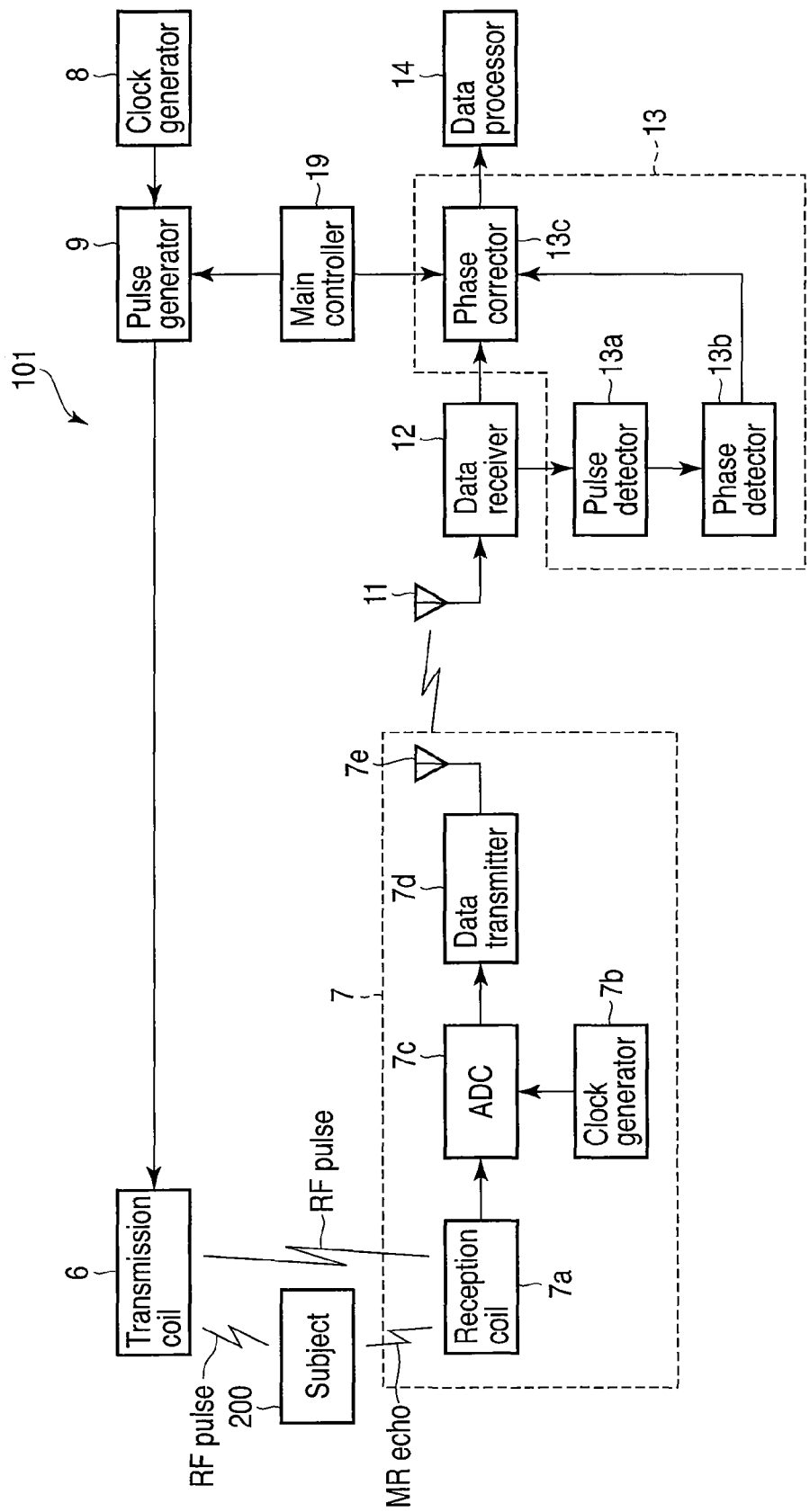
FIG. 2 is a block diagram of a coil side unit and a correction unit in FIG. 1.

FIG. 2 is a block diagram of the coil side unit 7 and the correction unit 13. It is to be noted that in FIG. 2, the same part as that of FIG. 1 is denoted with the same reference numerals.

The coil side unit 7 comprises a reception coil 7a, a clock generator 7b, an analog-digital converter (ADC) 7c, a data transmitter 7d and an antenna 7e.

The reception coil 7a receives MR echo emitted from the subject 200 or the RF pulse emitted from the transmission coil unit 6, to obtain an electric RF signal.

The clock generator 7b generates a second clock signal having substantially the same frequency as that of the first clock signal.

The ADC 7c samples and quantizes the RF signal obtained by the reception coil 7a every sampling timing synchronized with the second clock signal, to convert the RF signal to the RF data.

The data transmitter 7d generates the signal for transmission to wirelessly transmit the RF data. Specifically, the data transmitter 7d subjects the RF data to coding, modulation, level regulation and the like. That is, the data transmitter 7d subjects the RF data to the coding for digital transmission. To this coding, there can be applied, for example, a convolution code, a reed Solomon code, a turbo code, an LDCP code or the like. Then, the data transmitter 7d modulates a carrier wave by the coded RF data, to obtain the signal for transmission. Furthermore, the data transmitter 7d regulates the level of the signal for transmission to a level which is suitable for the wireless transmission, to supply the signal to the antenna 7e.

The antenna 7e emits the signal for transmission as the electromagnetic wave.

The correction unit 13 includes an RF pulse detector 13a, a phase detector 13b and a phase corrector 13c.

The RF pulse detector 13a detects the RF pulse signal from the RF signal indicated by the RF data extracted with the data receiver 12.

The phase detector 13b detects the phase of the RF pulse signal detected by the RF pulse detector 13a.

To the phase corrector 13c, the same RF parameter as that transferred to the pulse generator 9 is transferred by the main controller 19. The phase corrector 13c calculates the amount of the phase shift which occurs in the echo signal indicated by the RF data during the digitization in the ADC 7c, based on the phase indicated by the RF parameter and the phase detected by the phase detector 13b. The phase corrector 13c corrects the RF data so as to compensate for the above calculated phase shift amount. The RF data corrected by the phase corrector 13c is transferred, as an output of the correction unit 13, to the data processor 14.

Next, an operation of the MRI apparatus 101 having the above constitution will be described. However, there will be omitted description of an operation similar to that of the existing MRI apparatus, for example, an operation of generating the echo signal in the subject 200 and collecting the echo signals to reconstruct an image concerning the subject 200 based on the collected echo signals, and a characteristic operation of the MRI apparatus 101 will mainly be described.

Figure 3:
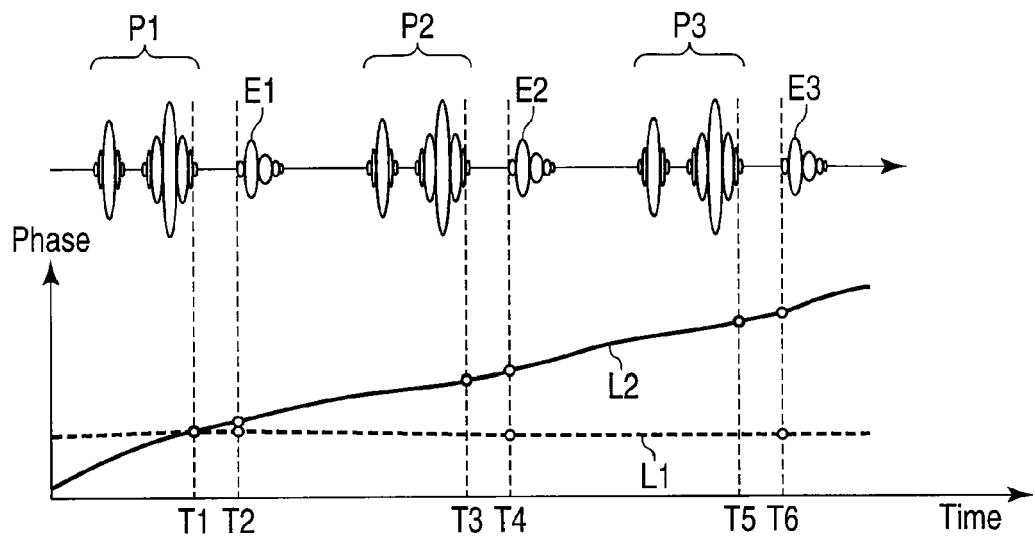
FIG. 3 is a diagram showing an example of a radio frequency signal obtained by a reception coil in FIG. 2 during imaging.

During imaging of the subject 200 in the MRI apparatus 101, the reception coil 7a receives the MR echo generated while a state of spin excited by the RF pulse emitted from the transmission coil unit 6 returns to a thermal equilibrium state. The MR echo is a weak electromagnetic wave, and hence the reception coil 7a is disposed in the vicinity of the subject 200. In consequence, the RF pulse also reaches the reception coil 7a. Therefore, the RF signal obtained by the reception coil 7a during the imaging becomes, for example, a signal shown in FIG. 3. That is, in the RF signal obtained by the reception coil 7a, echo signals E1, E2, E3 . . . are generated after RF pulse signals P1, P2, P3 . . . , respectively. It is to be noted that FIG. 3 shows an example in which each of the RF pulse signals P1, P2, P3 . . . comprises a combination of a 90 degree pulse and a 180 degree pulse, but this may vary in accordance with an applied pulse sequence.

The above RF signal including the RF pulse signal and the echo signal as they are is input into the ADC 7c. The ADC 7c digitizes the input RF signal synchronously with the second clock signal, to obtain the RF data.

Meanwhile, the clock generator 7b operates so as to generate the second clock signal having a frequency which is as close as possible with respect to the frequency of the first clock signal. However, in the clock generator 7b, the second clock signal is not synchronized with the first clock signal, and it is not assured that the frequencies of the first and second clock signals match each other. Further in actuality, a frequency shift occurs sometimes in the first and second clock signals owing to fluctuations of characteristics of constituent components of the clock generator 7b or the like. Moreover, when the frequency offset occurs in the first and second clock signals, a phase offset occurs in the RF signal indicated by the RF data with respect to the original RF signal before digitalized.

To simplify the description, it is supposed that the original phase at a reference timing in the RF pulse signal (hereinafter referred to as the normal RF phase) and the original phase at a reference timing in the echo signal (hereinafter referred to as the normal echo phase) are constant. In this case, time change characteristics of the normal RF phase and the normal echo phase become characteristics shown by a broken line L1 in FIG. 3. However, if the frequency offset occurs in the first and second clock signals, the time change characteristics of a phase at a reference timing of the RF pulse signal in the RF signal indicated by the RF data (hereinafter referred to as the actual RF phase) and a phase at a reference timing in the echo signal (hereinafter referred to as the actual echo phase) become, for example, characteristics shown by a solid line L2 in FIG. 3.

It is to be noted that, needless to say, there is a case where the normal RF phase is different from the normal echo phase, a case where the normal RF phase varies in a plurality of RF pulse signals, respectively, or a case where the normal echo phase varies in a plurality of echo signals. However, even in this case, if the frequency offset occurs in the first and second clock signals, the time change characteristics of the actual RF phase and actual echo phase still become different from those of the normal RF phase and normal echo phase. Moreover, there is a correlation between the time change characteristics of the actual RF phase and the time change characteristics of the actual echo phase.

Therefore, it is possible to compensate for an offset between the normal echo phase and the actual echo phase based on a phase difference between the normal RF phase and the actual RF phase, and for this purpose, correction is performed in the correction unit 13 as follows.

First, the RF pulse detector 13a detects the RF pulse signal from the RF signal indicated by the RF data.

Processing in the RF pulse detector 13a may be any processing as long as the RF pulse signal can be detected, but processing can be applied, for example, as follows.

(First Detection Processing Example)

A period for which the RF pulse is included in the RF signal is evident from a timing at which the pulse generator 9 outputs the RF pulse. Therefore, based on the RF parameter, the RF pulse detector 13a determines the period for which the RF pulse is included in the RF signal, and detects the RF data output from the data receiver 12 for this period as the data which indicates the RF pulse. However, in this case, the main controller 19 transfers the RF parameter to the RF pulse detector 13a. Alternatively, the pulse generator 9 or the main controller 19 may notify the RF pulse detector 13a of the period for which the pulse generator 9 outputs the RF pulse.

(Second Detection Processing Example)

Figure 4:
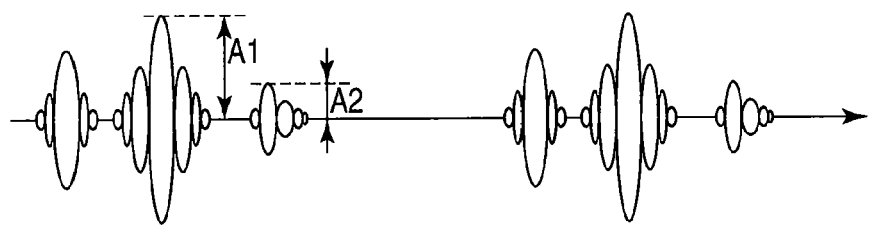
FIG. 4 is an enlarged diagram of a part of the radio frequency signal shown in FIG. 3.

In general, the amplitude of the RF pulse is larger than that of the echo signal. That is, as shown in FIG. 4, a maximum amplitude A1 of the RF pulse is larger than a maximum amplitude A2 of the echo signal. This property is utilized so that the RF pulse detector 13a recognizes that when the amplitude of the RF signal indicated by the RF data is above a threshold value set to be smaller than the amplitude A1 and larger than the amplitude A2, the RF data indicating the RF pulse is input. The pulse detector detects the RF data as the data indicating the RF pulse.

(Third Detection Processing Example)

Usually in the ADC 7c, there is a limit to an amplitude level which can be represented. Furthermore, when a range of the amplitude level which can be represented is regulated in accordance with the maximum amplitude A2 of the echo signal as shown by, for example, R1 in FIG. 5, a partial section of the RF signal indicated by the RF data is saturated as in, for example, a section P11 shown in FIG. 5. These properties are utilized so that the RF pulse detector 13a recognizes that after the RF signal indicated by the RF data is saturated, the RF data indicating the RF pulse is input at a timing at which this saturation is eliminated, and the detector detects the RF data as the data which indicates the RF pulse.

Next, the phase detector 13b detects the phase at the reference timing in the RF pulse detected by the RF pulse detector 13a, i.e., the actual RF phase.

Figure 5:
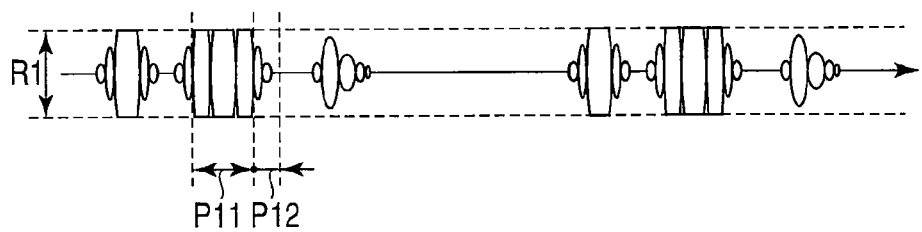
FIG. 5 is a diagram showing a part of the radio frequency signal saturated owing to influence of a saturation level of an ADC in FIG. 2.

It is to be noted that when a waveform of the RF pulse signal indicated by the RF data is saturated as shown in FIG. 5, a waveform of this saturated portion is distorted. When the phase detector 13b detects the phase by use of such a distorted waveform, an error is generated in the detection result sometimes. Therefore, the phase detector 13b preferably uses a waveform of a section where any saturation does not occur as in a section P12 of FIG. 5.

When the frequency of the RF pulse is known, the phase detector 13b calculates a correlation between frequency components of the RF pulse and the RF pulse signal detected by the RF pulse detector 13a, whereby the phase can be obtained.

Meanwhile, the phase corrector 13c corrects the RF data so as to compensate for the phase offset which occurs in the signal indicated by the RF data, based on the actual RF phase detected by the phase detector 13b. The processing in the phase corrector 13c may be any processing as long as the phase offset which occurs in the signal indicated by the RF data is decreased, but the processing can be applied, for example, as follows.

(First Correction Processing Example)

When the phase detector 13b newly detects the actual RF phase, the phase corrector 13c obtains a phase difference between the actual RF phase and the normal RF phase. Moreover, the phase corrector 13c sets a correction value with which the phase difference can be decreased. Typically, a value having the same absolute value as that of the phase difference between the actual RF phase and the normal RF phase and having a different direction is set as the correction value. That is, when the phase difference between the actual RF phase and the normal RF phase is +30 degrees, the phase corrector 13c sets the correction value to −30 degrees. Moreover, the phase corrector 13c applies the correction value set in this manner until the actual RF phase is next detected, to correct the RF data so that the phase changes as much as the correction value.

Figure 6:
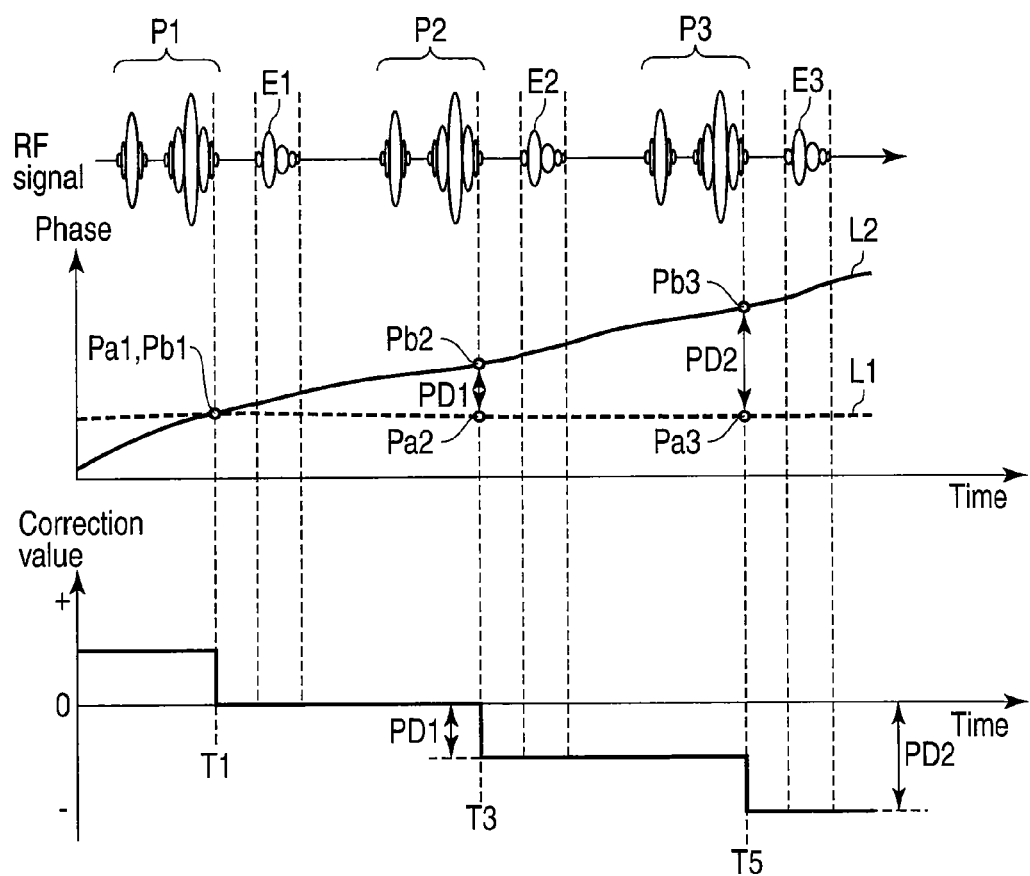
FIG. 6 is a diagram showing an example of change of a correction value set in a first correction processing example.

FIG. 6 is a diagram showing an example of change of the correction value set in a first correction processing example. In FIG. 6, it is assumed that the normal RF phase and the actual RF phase have time change characteristics shown in FIG. 3.

In this case, an actual RF phase Pb1 detected at timing T1 matches a normal RF phase Pa1, and a phase difference between the actual RF phase Pb1 and the normal RF phase Pa1 is 0. Therefore, the phase corrector 13c holds a correction value of 0 till timing T3 when the actual RF phase is next detected. In consequence, an echo signal E1 is not subjected to phase correction.

A phase difference between a detected actual RF phase Pb2 and a normal RF phase Pa2 at the timing T3 is PD1. Therefore, the phase corrector 13c holds a correction value −PD1 till timing T5 when the actual RF phase is next detected. In consequence, an echo signal E2 is corrected so as to delay the phase as much as PD1.

Thus, in the first correction processing example, the phase difference between the actual RF phase detected based on a certain RF pulse signal and the normal RF phase is regarded as the amount of a phase offset which occurs in the echo signal immediately after the RF pulse signal, thereby setting the correction value to compensate for the phase offset in the echo signal. However, as shown in FIG. 3, the timing at which the actual RF phase is detected is different from the timing of the echo signal, and hence the amount of the phase offset of the echo signal becomes different from the phase difference between the actual RF phase and the normal RF phase sometimes, and the phase offset amount in one echo signal varies with time sometimes. For example, in FIG. 3, a phase difference between the actual RF phase and the normal RF phase at timing T2 is larger than that at timing T1, the phase difference at timing T4 is larger than that at timing T3, and the phase difference at timing T6 is larger than that at timing T5, respectively. However, a period from the stop of the emission of the RF pulse signal to the generation of the echo signal or a period for which one echo signal is generated is short, and hence the phase offset amount for the period is also small. In consequence, the first correction processing example can sufficiently decrease the phase offset in the echo signal.

(Second Correction Processing Example)

The phase corrector 13c beforehand holds at least one actual RF phase detected in the past by the phase detector 13b. The actual RF phase held by the phase corrector 13c preferably includes the most recently detected phase. When the phase detector 13b newly detects the actual RF phase, by interpolation processing with respect to this newly detected actual RF phase and the above held past actual RF phase, the phase corrector 13c determines the change characteristics of the actual RF phase from the previous detection timing of the actual RF phase to the present detection timing thereof. Then, the phase corrector 13c estimates the actual RF phase around a timing of an incoming echo signal, based on the above change characteristics. Furthermore, the phase corrector 13c obtains the phase difference between the estimated actual RF phase and the normal RF phase. Then, the phase corrector 13c sets the correction value by which the phase difference can be decreased. However, the correction value set herein is to be applied to the RF data received by the data receiver 12 from the previous detection timing of the actual RF phase to the present detection timing thereof. Therefore, the phase corrector 13c stores the RF data for at least an RF pulse signal repeating cycle. Then, the RF data received by the data receiver 12 from the previous detection timing of the actual RF phase to the present detection timing thereof is corrected so as to change the phase as much as the correction value newly set as described above.

Figure 7:
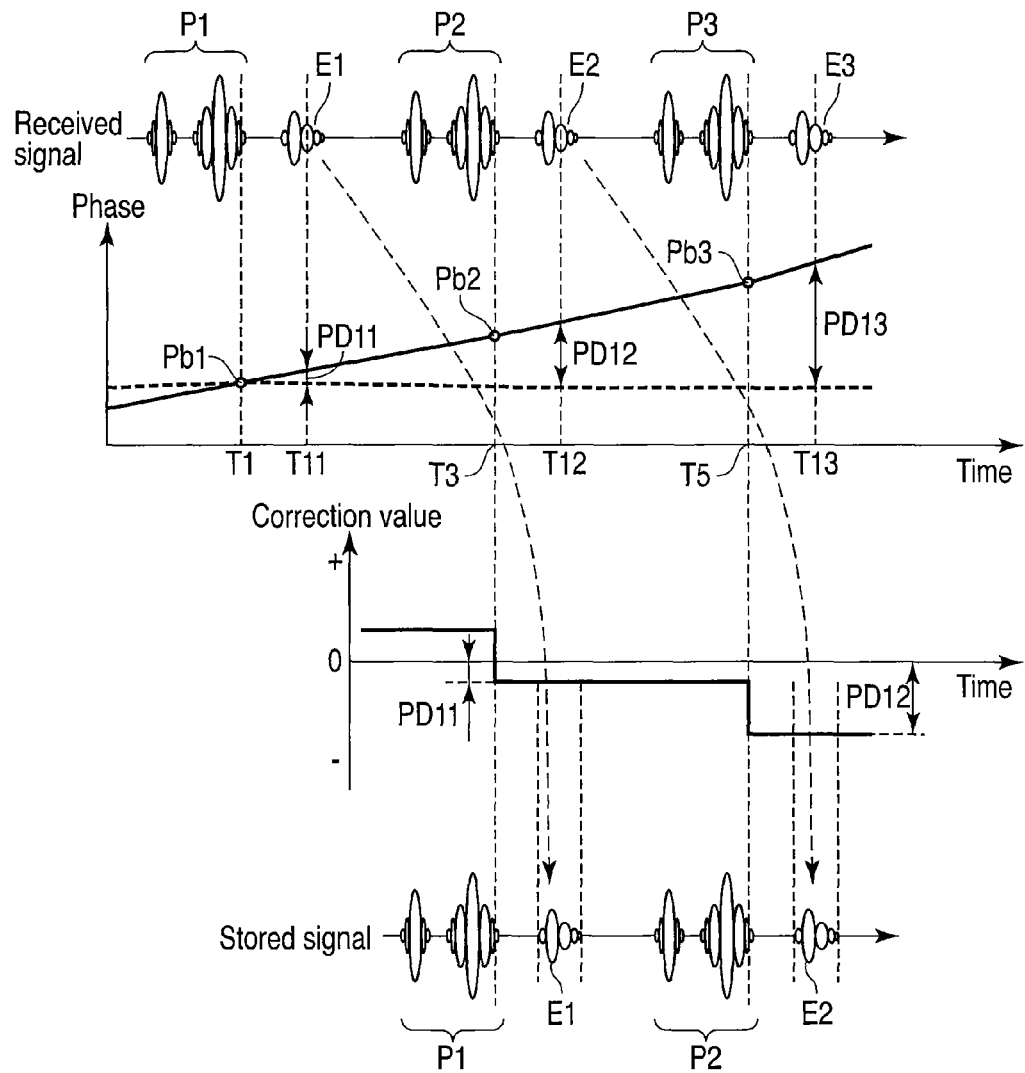
FIG. 7 is a diagram showing an example of change of a correction value set in a second correction processing example.

FIG. 7 is a diagram showing an example of change of the correction value set in a second correction processing example. In FIG. 7, it is assumed that the normal RF phase and the actual RF phase have time change characteristics shown in FIG. 3.

In this case, the phase corrector 13c estimates the change characteristics of the actual RF phase for a period from timing T1 to timing T3 as shown in FIG. 7, based on an actual RF phase Pb1 detected at the timing T1 and an actual RF phase Pb2 detected at the timing T3. Based on the characteristics, the phase corrector 13c obtains a phase difference PD11 between the actual RF phase and the RF normal phase at timing T11, and sets a correction value from the timing T3 to timing T5 to −PD11. Then, for this period, the RF data received by the data receiver 12 for the period from the timing T1 to the timing T3 is corrected so as to delay the phase as much as PD11. That is, an echo signal E1 is corrected so as to delay the phase as much as PD11.

Consequently, in the second correction processing example, the phase offset amount around a timing of an incoming echo signal is estimated based on a plurality of actual RF phases detected based on a plurality of RF pulse signals, respectively, thereby setting the correction value to compensate for the phase offset in the echo signal. However, as shown in FIG. 3, the phase offset amount varies with time even in one echo signal sometimes. However, a period for which the one echo signal is generated is short, and hence the phase offset amount for the period is also small. In consequence, the second correction processing example can sufficiently decrease the phase offset in the echo signal.

(Third Correction Processing Example)

The phase corrector 13c determines the change characteristics of the actual RF phase from the previous detection timing of the actual RF phase to the present detection timing thereof in the same manner as in the second correction processing example. Then, the phase corrector 13c obtains the change characteristics of the correction value as characteristics obtained by reversing tilt of the change characteristics of the phase difference between the actual RF phase and the normal RF phase based on the change characteristics of the actual RF phase. Then, the phase corrector 13c sets the correction value from the present detection timing of the actual RF phase to the next detection timing thereof in accordance with the above change characteristics of the correction value. Furthermore, the phase corrector 13c corrects the stored RF data with the correction value set as described above in the same manner as in the second correction processing example.

Figure 8:
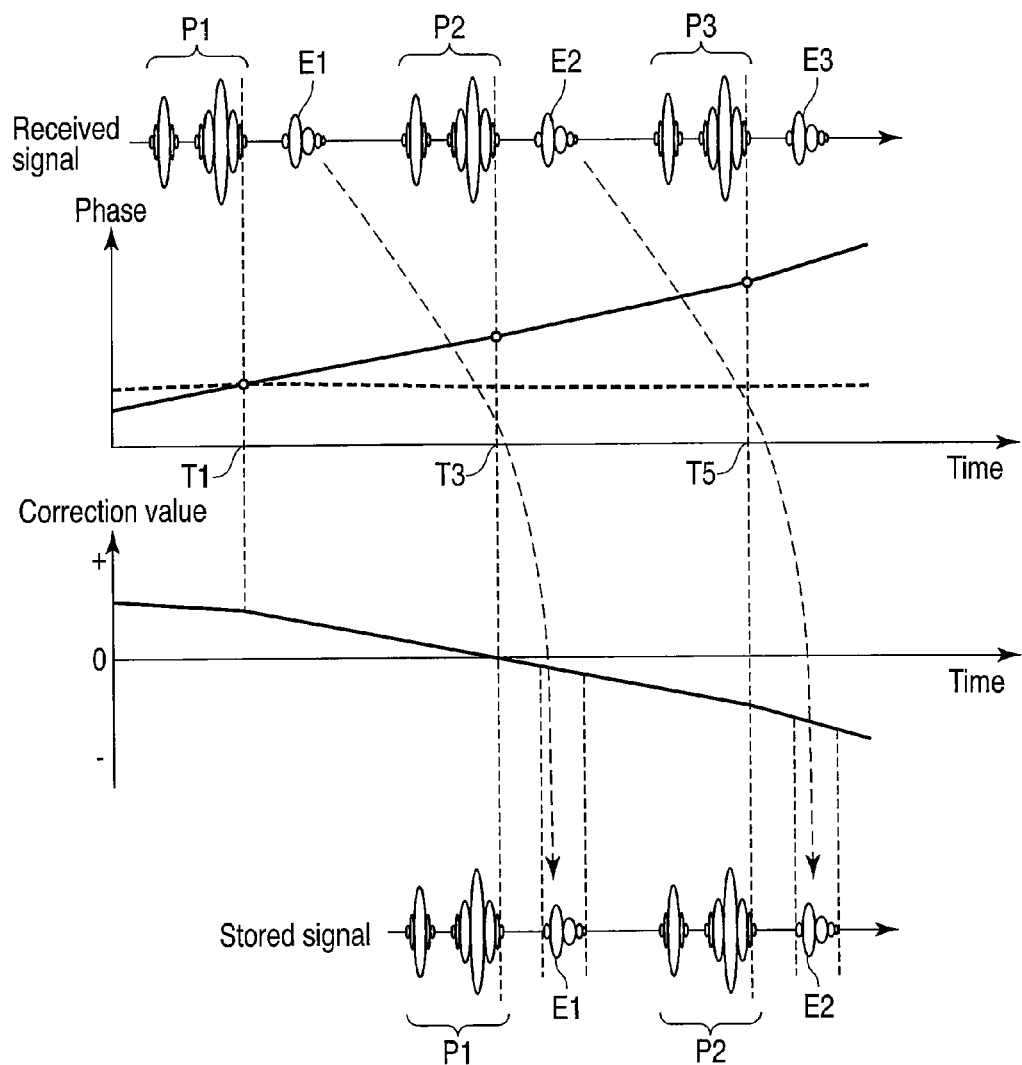
FIG. 8 is a diagram showing an example of change of a correction value set in a third correction processing example.

FIG. 8 is a diagram showing an example of change of the correction value set in a third correction processing example. In FIG. 8, it is assumed that the normal RF phase and the actual RF phase have time change characteristics shown in FIG. 3.

In this case, the phase corrector 13c estimates the change characteristics of the actual RF phase for a period from timing T1 to timing T3 as shown in FIG. 8, based on an actual RF phase Pb1 detected at the timing T1 and an actual RF phase Pb2 detected at the timing T3. Based on the characteristics, the phase corrector 13c sets a correction value from the timing T3 to timing T5 while changing the correction value with the change characteristics shown in FIG. 8. Then, for this period, the RF data received by the data receiver 12 for the period from the timing T1 to the timing T3 is corrected so as to delay the phase as much as the correction value set with the above change characteristics.

In consequence, the third correction processing example sets the correction value so as to follow the change of the phase offset amount based on the change characteristics of the phase difference between the actual RF phase and the normal RF phase. Consequently, there is considered even an offset between the timing of detection of the actual RF phase and the timing of the echo signal, or the change of the phase offset amount due to continuation of one echo signal for a certain length of period, whereby compensation can be performed. In consequence, the phase offset in the echo signal can accurately be decreased.

It is to be noted that FIG. 7 and FIG. 8 show an example in which linear interpolation is employed as interpolation processing to obtain the change characteristics of the actual RF phase. However, it is possible to arbitrarily employ another interpolation process such as interpolation by a least square curve or spline interpolation.

As described above, according to the first embodiment, both the echo signal and the RF pulse signal are digitized by the ADC 7c, thereby setting the correction value to compensate for the phase offset which occurs in the echo signal during the digitization, based on the phase offset which occurs in the RF pulse signal during the digitization, whereby the phase of the echo signal is corrected as much as the correction value. Therefore, even when a frequency offset occurs between the first clock signal and the second clock signal, the phase offset of the echo signal due to the frequency offset can be decreased. In consequence, it is possible to accurately reconstruct an image based on the echo signal which only has a small phase offset.

Second Embodiment

A schematic constitution of an MRI apparatus 102 in a second embodiment is similar to the MRI apparatus 101 in the first embodiment. Moreover, the MRI apparatus 102 is different from the MRI apparatus 101 in constitutions of a coil side unit 7 and a correction unit 13.

Figure 9:
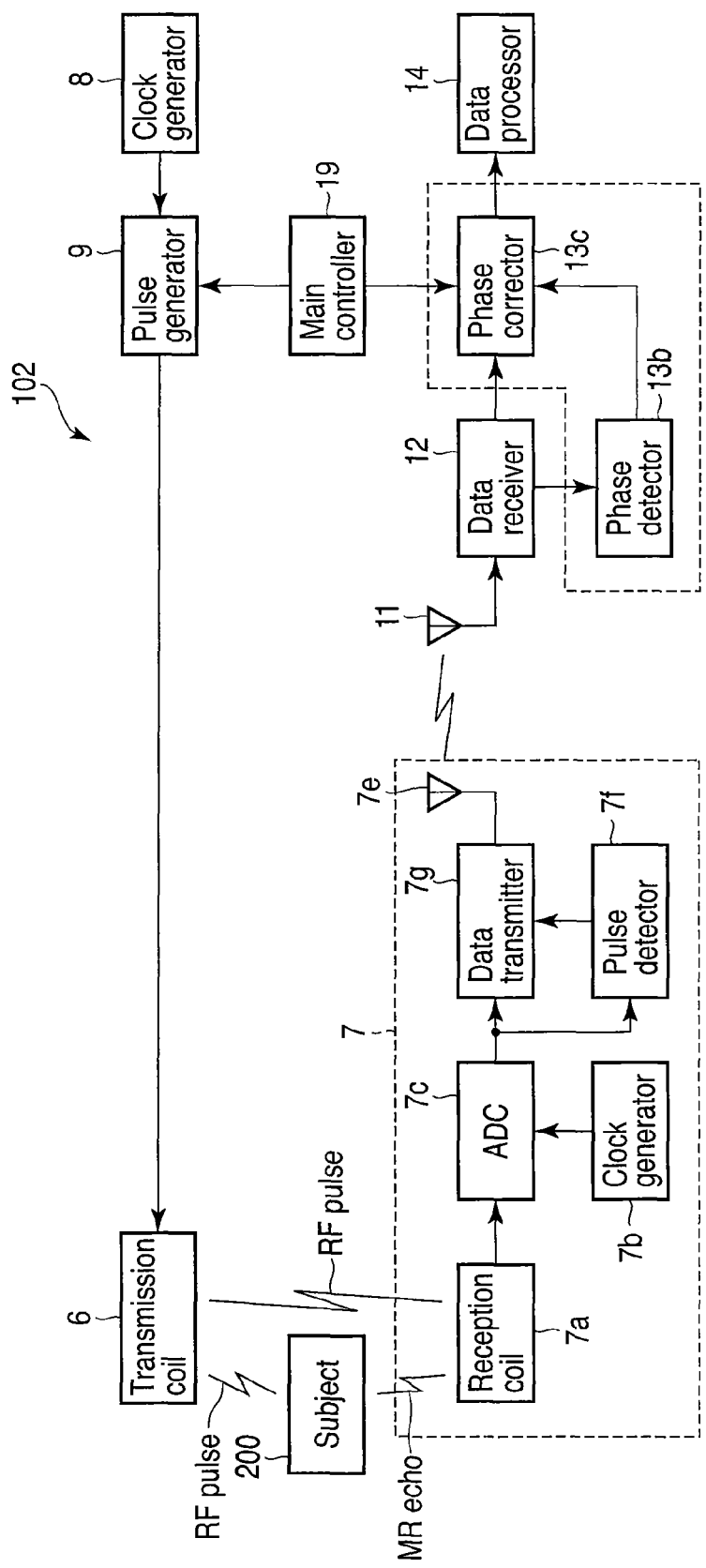
FIG. 9 is a block diagram showing a constitution of a main part of an MRI apparatus according to a second embodiment.

FIG. 9 is a block diagram showing a constitution of a main part of the MRI apparatus 102. It is to be noted that in FIG. 9, the same part as that of FIG. 1 and FIG. 2 is denoted with the same reference numerals, and detailed description thereof is omitted.

The coil side unit 7 of the MRI apparatus 102 comprises a reception coil 7a, a clock generator 7b, an ADC 7c, an antenna 7e, an RF pulse detector 7f and a data transmitter 7g. That is, the coil side unit 7 of the MRI apparatus 102 comprises the data transmitter 7g in place of the data transmitter 7d of the coil side unit 7 of the MRI apparatus 101, and additionally comprises the RF pulse detector 7f.

Into the RF pulse detector 7f, RF data output from the ADC 7c is input. The RF pulse detector 7f detects an RF pulse signal from an RF signal indicated by the RF data with processing similar to that of the RF pulse detector 13a of the first embodiment.

The data transmitter 7g obtains a signal for transmission by processing similar to that of the data transmitter 7d. However, based on the detection result of the RF pulse detector 7f, the data transmitter 7g generates the signal for transmission based on an only part of the RF data output from the ADC 7c and including a portion indicating the RF pulse signal and an echo signal.

The correction unit 13 of the MRI apparatus 102 comprises a phase detector 13b and a phase corrector 13c. That is, the correction unit 13 of the MRI apparatus 102 does not include the RF pulse detector 13a of the correction unit 13 of the MRI apparatus 101. Moreover, the RF data output from the data receiver 12 is input into the phase detector 13b.

The MRI apparatus 102 is different from the MRI apparatus 101 in that the coil side unit 7 performs only detection of the RF pulse signal with respect to correction processing of the RF data to compensate for the phase offset of the echo signal as described in the first embodiment.

Thus, this second embodiment can obtain an effect similar to that of the first embodiment.

Furthermore, according to the second embodiment, a section of the RF data which does not indicate the RF pulse signal or the echo signal is not wirelessly transmitted. Therefore, the amount of the data to be wirelessly transmitted can be decreased. That is, a transmission rate of the data by the data transmitter 7g can be lowered as compared with the data transmitter 7d.

However, since the second embodiment comprises the RF pulse detector 7f, the coil side unit 7 might be enlarged as compared with that of the first embodiment. To solve the problem, when the miniaturization of the coil side unit 7 is achieved in preference to the lowering of the transmission rate of the data, the first embodiment is more suitable than the second embodiment.

Third Embodiment

A schematic constitution of an MRI apparatus 103 in a third embodiment is similar to the MRI apparatus 101 in the first embodiment. Moreover, the MRI apparatus 103 is different from the MRI apparatus 101 in constitutions of a coil side unit 7 and a correction unit 13.

Figure 10:
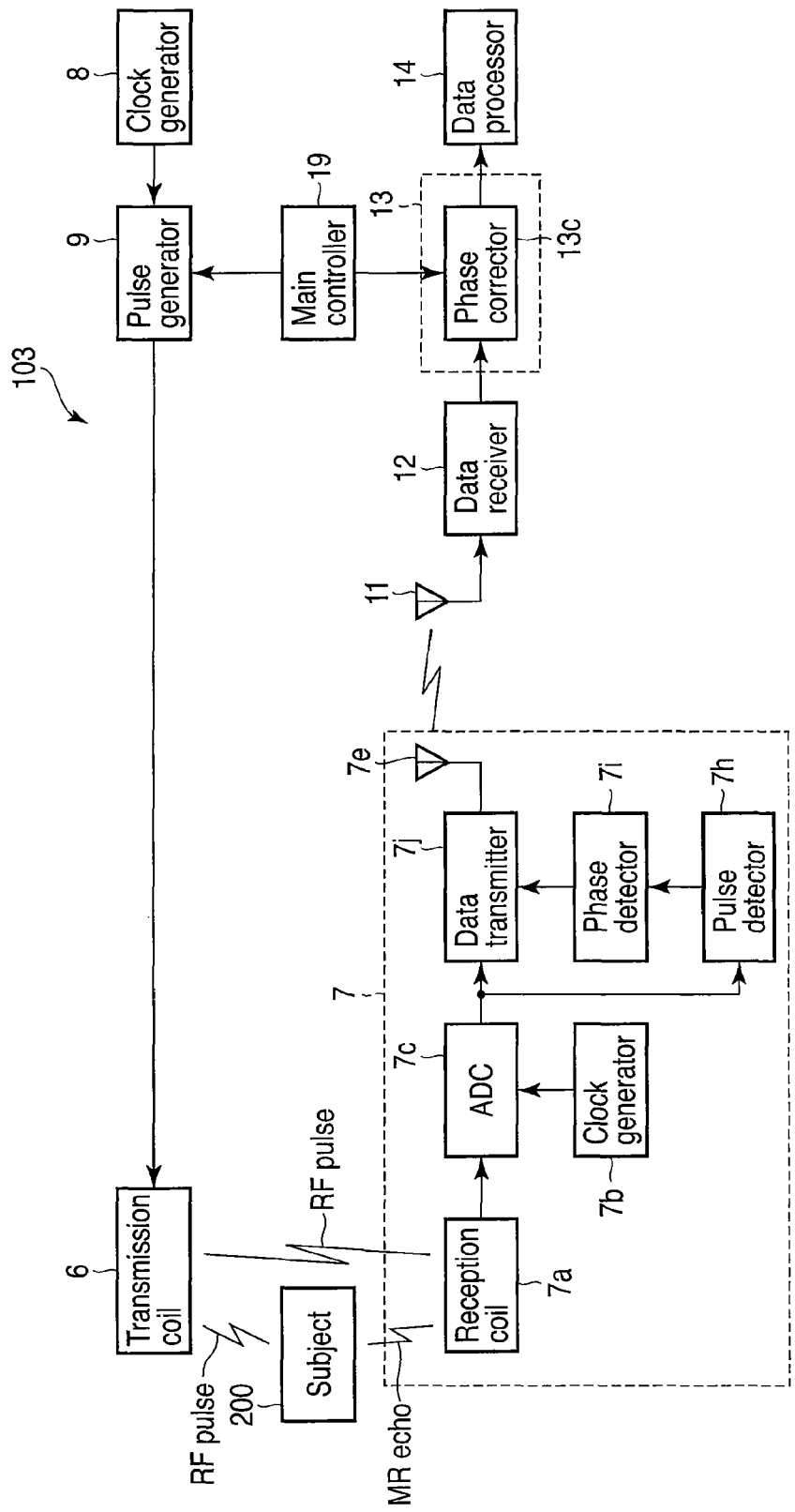
FIG. 10 is a block diagram showing a constitution of a main part of an MRI apparatus according to a third embodiment.

FIG. 10 is a block diagram showing a constitution of a main part of the MRI apparatus 103. It is to be noted that in FIG. 10, the same part as that of FIG. 1 and FIG. 2 is denoted with the same reference numerals, and detailed description thereof is omitted.

The coil side unit 7 of the MRI apparatus 103 comprises a reception coil 7a, a clock generator 7b, an ADC 7c, an antenna 7e, an RF pulse detector 7h, a phase detector 7i and a data transmitter 7j. That is, the coil side unit 7 of the MRI apparatus 103 comprises the data transmitter 7j in place of the data transmitter 7d of the coil side unit 7 of the MRI apparatus 101, and additionally comprises the RF pulse detector 7h and the phase detector 7i.

Into the RF pulse detector 7h, RF data output from the ADC 7c is input. The RF pulse detector 7h detects an RF pulse signal from an RF signal indicated by the RF data with processing similar to that of the RF pulse detector 13a of the first embodiment.

The phase detector 7i performs processing similar to that of the phase detector 13b of the first embodiment, to detect the phase of an RF pulse detected by the RF pulse detector 7h, thereby outputting phase data indicating a phase value of the RF pulse phase.

The data transmitter 7j obtains a signal for transmission by processing similar to that of the data transmitter 7d. However, the data transmitter 7g generates the signal for transmission based on an only part of the RF data output from the ADC 7c and including a portion indicating an echo signal. Moreover, the data transmitter 7d generates the signal for transmission based on the phase data output from the phase detector 7i.

The correction unit 13 of the MRI apparatus 103 comprises a phase corrector 13c. That is, the correction unit 13 of the MRI apparatus 103 does not include the RF pulse detector 13a and the phase detector 13b of the correction unit 13 of the MRI apparatus 101. Moreover, the RF data and phase data output from the data receiver 12 are input into the phase corrector 13c.

The MRI apparatus 103 is different from the MRI apparatus 101 in that the coil side unit 7 performs detection of the RF pulse and detection of an actual RF phase concerning processing to correct the RF data, thereby compensating for a phase offset of the echo signal as described in the first embodiment.

In consequence, this third embodiment can obtain an effect similar to that of the first embodiment.

Furthermore, according to the third embodiment, a section of the RF data which does not indicate the echo signal is not wirelessly transmitted. Therefore, the amount of the data to be wirelessly transmitted can be decreased. That is, a transmission rate of the data by the data transmitter 7j can be lowered as compared with the data transmitter 7d. It is to be noted that according to the third embodiment, in addition to the RF data, the phase data needs to be wirelessly transmitted, but the phase data only needs to indicate one phase value, so that a data size may be small. The amount of the data to be wirelessly transmitted can be decreased as compared with the first and second embodiments.

However, since the third embodiment comprises the RF pulse detector 7h and the phase detector 7i, the coil side unit 7 might be enlarged as compared with that of the first or second embodiment. To solve the problem, when the miniaturization of the coil side unit 7 is achieved in preference to the lowering of the transmission rate of the data, the first or second embodiment is more suitable than the third embodiment.

Fourth Embodiment

Figure 11:
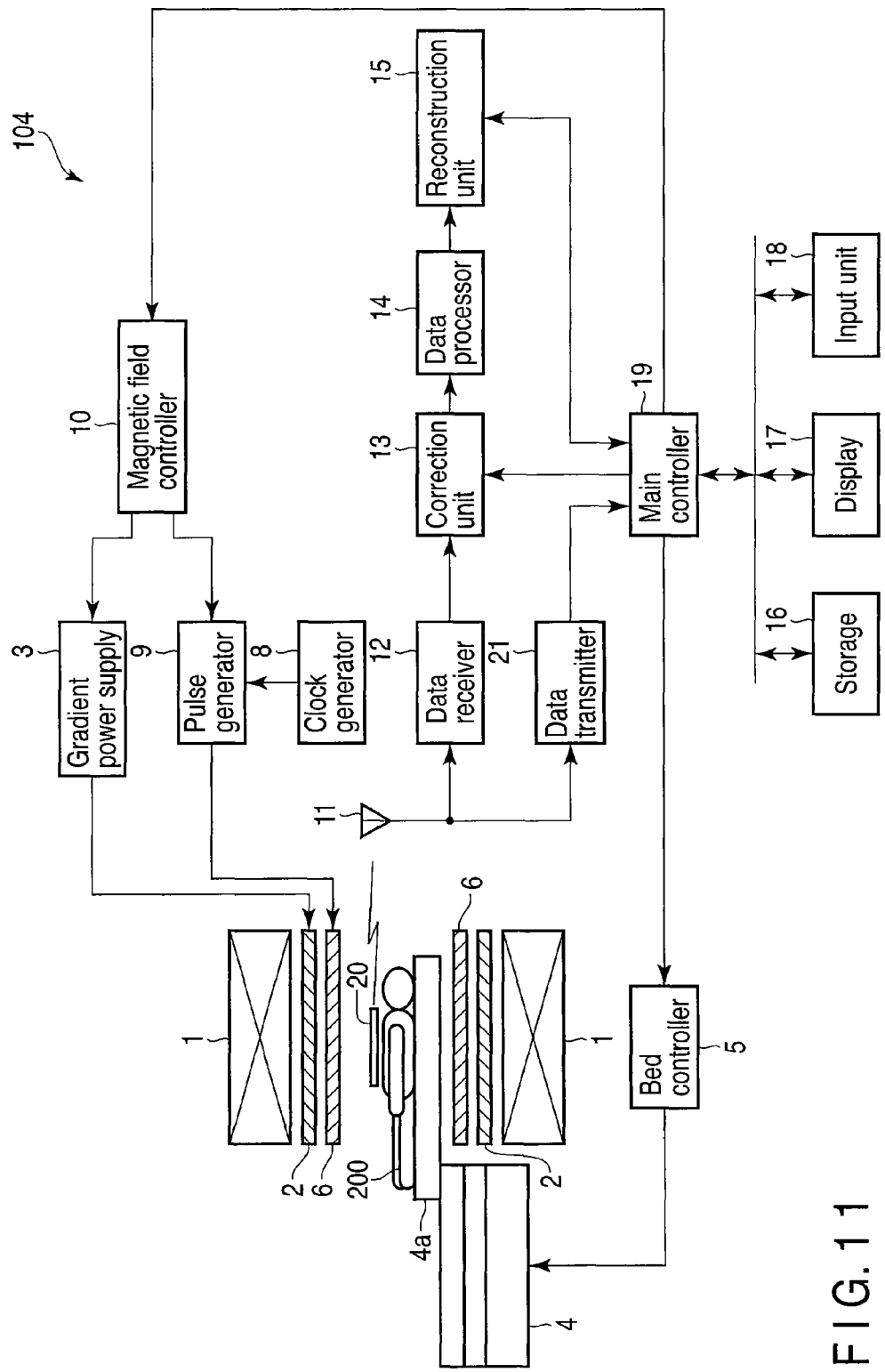
FIG. 11 is a diagram showing a constitution of an MRI apparatus according to a fourth embodiment.

FIG. 11 is a diagram showing a constitution of an MRI apparatus 104 according to a fourth embodiment. It is to be noted that the same part as that of FIG. 1 is denoted with the same reference numerals, and detailed description thereof is omitted.

The MRI apparatus 104 comprises a static magnet 1, a gradient coil 2, a gradient power supply 3, a bed 4, a bed controller 5, a transmission coil unit 6, a clock generator 8, a pulse generator 9, a magnetic field controller 10, an antenna 11, a data receiver 12, a correction unit 13, a data processor 14, a reconstruction unit 15, a storage 16, a display 17, an input unit 18, a main controller 19, a coil side unit 20 and a data transmitter 21.

That is, the MRI apparatus 104 comprises the coil side unit 20 in place of the coil side unit 7 of the MRI apparatus 101. Furthermore, the MRI apparatus 104 additionally comprises the data transmitter 21.

The coil side unit 20 is mounted on a top plate 4a or attached to a subject 200. Moreover, during imaging, the coil side unit, together with the subject 200, is inserted into an imaging space, and the unit receives an electromagnetic wave including MR echo emitted from the subject 200 or an RF pulse emitted from the transmission coil unit 6, to obtain an electric RF signal. The coil side unit 20 wirelessly transmits a signal for ascending transmission including RF data obtained by digitalizing the RF signal.

The data transmitter 21 is provided with an RF parameter from the main controller 19. The data transmitter 21 generates a signal for descending transmission including the RF parameter, to supply this signal for descending transmission to the antenna 11. It is to be noted that the signal for descending transmission can be separated from the signal for ascending transmission by utilizing a well known bidirectional communication system such as frequency division duplex (FDD), time division duplex (TDD) or code division duplex (CDD). The antenna 11 may separately be prepared for the data receiver 12 and the data transmitter 21. In this case, two or more antennas are disposed.

Figure 12:
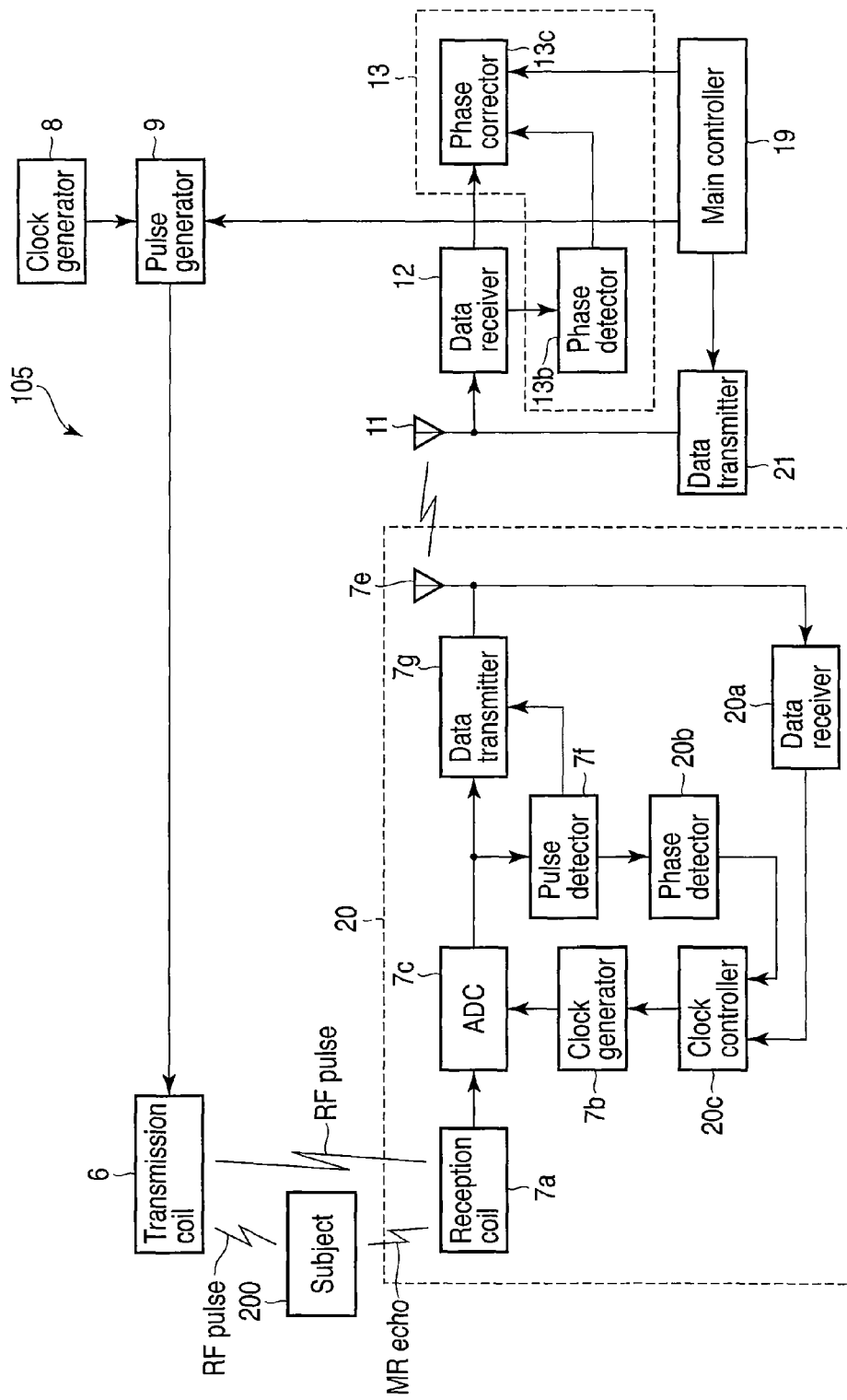
FIG. 12 is a block diagram of a correction unit and a coil side unit in FIG. 11.

FIG. 12 is a block diagram of the correction unit 13 and the coil side unit 20. It is to be noted that in FIG. 12, the same part as that of FIG. 1, FIG. 2 and FIG. 9 is denoted with the same reference numerals.

The coil side unit 20 comprises a reception coil 7a, a clock generator 7b, an ADC 7c, an antenna 7e, an RF pulse detector 7f, a data transmitter 7g, a data receiver 20a, a phase detector 20b and a clock controller 20c. That is, the coil side unit 20 comprises the data receiver 20a, the phase detector 20b and the clock controller 20c in addition to the elements of the coil side unit 7 of the second embodiment. The antenna 7e may separately be prepared for the data receiver 20a and the data transmitter 7d. In this case, two or more antennas are disposed.

The data receiver 20a receives, by the antenna 7e, the signal for descending transmission wirelessly transmitted from the data transmitter 21 via the antenna 11, to extract the RF parameter from this signal for descending transmission. The data receiver 20a transfers the extracted RF parameter to the clock controller 20c.

The phase detector 20b performs processing similar to that of the phase detector 13b of the first embodiment, to detect a phase of the RF pulse detected by the RF pulse detector 7f, thereby outputting phase data indicating a phase value of the RF pulse phase.

To the clock controller 20c, the same RF parameter as that transferred to the pulse generator 9 is transferred from the main controller 19 via the data transmitter 21, the antennas 11 and 7e and the data receiver 20a. The clock controller 20c obtains a time change tendency of a phase difference between the phase indicated by the RF parameter and the phase detected by the phase detector 20b, and controls the clock generator 7b so as to regulate the frequency of a second clock signal based on the tendency.

The MRI apparatus 104 corrects the RF data to compensate for a phase offset which occurs in an echo signal during digitization by the ADC 7c in the same manner as in the second embodiment. In consequence, this fourth embodiment can obtain an effect similar to that of the first embodiment.

Meanwhile, when a phase offset amount of an actual RF phase with respect to a normal RF phase exceeds ±180 degrees, the phase offset amount cannot correctly be determined. For example, phase rotation of +190 degrees has the same phase as that of phase rotation of −170 degrees, and these two states cannot be distinguished. Such a state where the phases cannot be distinguished will be referred to as the indeterminacy of the phase. When this state occurs, the phase corrector 13c cannot adequately perform correction.

However, in the MRI apparatus 104, the clock controller 20c monitors the time change tendency of the phase difference between the actual RF phase detected by the phase detector 20b and the normal RF phase. Moreover, the clock controller 20c controls the clock generator 7b so as to lower the frequency of the second clock signal if the phase difference tends to increase with time and so as to raise the frequency of the second clock signal if the phase difference tends to decrease with time.

In consequence, a frequency difference between a first clock signal and the second clock signal is kept to be small, it is possible to lower a possibility that the phase offset amount of the actual RF phase with respect to the normal RF phase exceeds ±180 degrees, and it is possible to lower a possibility that the indeterminacy of the phase occurs. Therefore, it is possible to raise a possibility that the phase corrector 13c can adequately perform correction.

Fifth Embodiment

A schematic constitution of an MRI apparatus 105 in a fifth embodiment is similar to the MRI apparatus 104 in the fourth embodiment. Moreover, the MRI apparatus 105 is different from the MRI apparatus 104 in constitutions of a correction unit 13 and a coil side unit 20.

FIG. 13 is a block diagram of the correction unit 13 and the coil side unit 20. It is to be noted that in FIG. 13, the same part as that of FIG. 1, FIG. 2 and FIG. 10 is denoted with the same reference numerals.

The coil side unit 20 comprises a reception coil 7a, a clock generator 7b, an ADC 7c, an antenna 7e, an RF pulse detector 7h, a phase detector 7i, a data transmitter 7j, a data receiver 20d and a clock controller 20e. That is, the coil side unit 20 comprises the data receiver 20d and the clock controller 20e in addition to the elements of the coil side unit 7 of the third embodiment.

The data receiver 20d receives, by the antenna 7e, a signal for descending transmission wirelessly transmitted from a data transmitter 21 via an antenna 11, to extract an RF parameter from this signal for descending transmission. The data receiver 20d transfers the extracted RF parameter to the clock controller 20e.

To the clock controller 20e, the same RF parameter as that transferred to a pulse generator 9 is transferred from a main controller 19 via the data transmitter 21, the antennas 11 and 7e and the data receiver 20d. The clock controller 20e obtains a time change tendency of a phase difference between a phase indicated by the RF parameter and the phase detected by the phase detector 7i, and controls the clock generator 7b so as to regulate the frequency of a second clock signal based on the tendency.

The MRI apparatus 105 corrects RF data to compensate for a phase offset which occurs in an echo signal during digitization by the ADC 7c in the same manner as in the third embodiment. In consequence, this fifth embodiment can obtain an effect similar to that of the first embodiment.

Furthermore, in the MRI apparatus 105, the clock controller 20e monitors the time change tendency of the phase difference between the actual RF phase detected by the phase detector 7i and the normal RF phase. Moreover, the clock controller 20e controls the clock generator 7b so as to lower the frequency of the second clock signal if the phase difference tends to increase with time and so as to raise the frequency of the second clock signal if the phase difference tends to decrease with time.

In consequence, a frequency difference between a first clock signal and the second clock signal is kept to be small, it is possible to lower a possibility that the phase offset amount of the actual RF phase with respect to the normal RF phase exceeds ±180 degrees, and it is possible to lower a possibility that indeterminacy of the phase occurs. Therefore, it is possible to raise a possibility that a phase corrector 13c can adequately perform correction.

Sixth Embodiment

Figure 14:
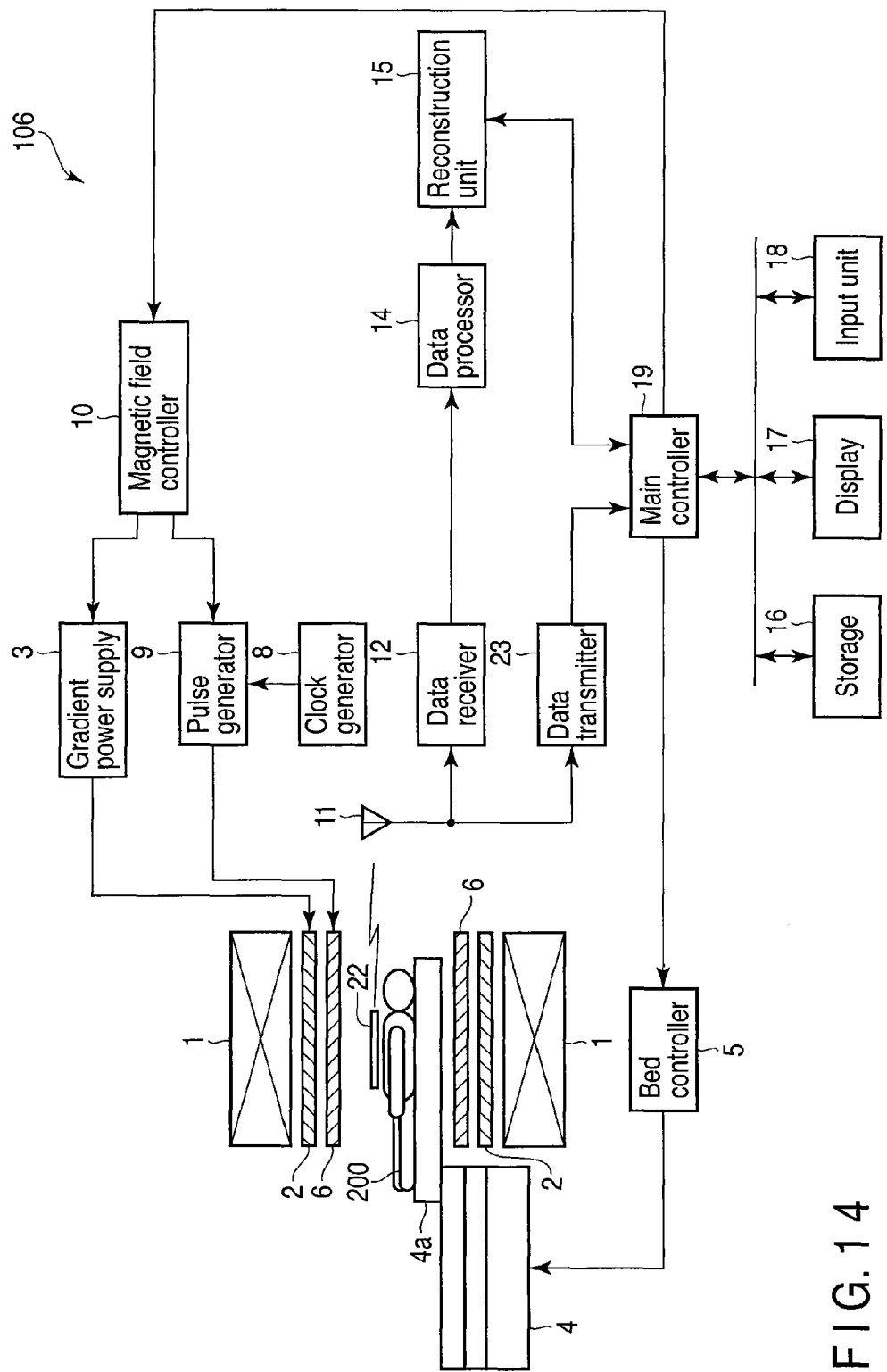
FIG. 14 is a diagram showing a constitution of an MRI apparatus according to a sixth embodiment.

FIG. 14 is a diagram showing a constitution of an MRI apparatus 106 according to a sixth embodiment. It is to be noted that the same part as that of FIG. 1 is denoted with the same reference numerals, and detailed description thereof is omitted.

The MRI apparatus 106 comprises a static magnet 1, a gradient coil 2, a gradient power supply 3, a bed 4, a bed controller 5, a transmission coil unit 6, a clock generator 8, a pulse generator 9, a magnetic field controller 10, an antenna 11, a data receiver 12, a data processor 14, a reconstruction unit 15, a storage 16, a display 17, an input unit 18, a main controller 19, a coil side unit 22 and a data transmitter 23.

That is, the MRI apparatus 106 comprises the coil side unit 22 in place of the coil side unit 7 of the MRI apparatus 101. Furthermore, the MRI apparatus 106 does not comprise the correction unit 13, and additionally comprises the data transmitter 23. Since the correction unit 13 is not disposed, RF data output from the data receiver 12 is input into the data processor 14.

The coil side unit 22 is mounted on a top plate 4a or attached to a subject 200. Moreover, during imaging, the coil side unit, together with the subject 200, is inserted into an imaging space, and the unit receives an electromagnetic wave including MR echo emitted from the subject 200 or an RF pulse emitted from the transmission coil unit 6, to obtain an electric RF signal. This RF signal includes an MR echo signal indicating the MR echo (hereinafter referred to as the echo signal) and an RF pulse signal indicating the RF pulse. The coil side unit 22 wirelessly transmits a signal for ascending transmission including RF data obtained by digitizing the RF signal and performing correction processing in the same manner as in the correction unit 13 of the first embodiment.

The data transmitter 23 is provided with an RF parameter from the main controller 19. The data transmitter 23 generates a signal for descending transmission including the RF parameter, to supply this signal for descending transmission to the antenna 11. It is to be noted that the signal for descending transmission can be separated from the signal for ascending transmission by utilizing a well known bidirectional communication system such as frequency division duplex (FDD) or time division duplex (TDD).

Figure 15:
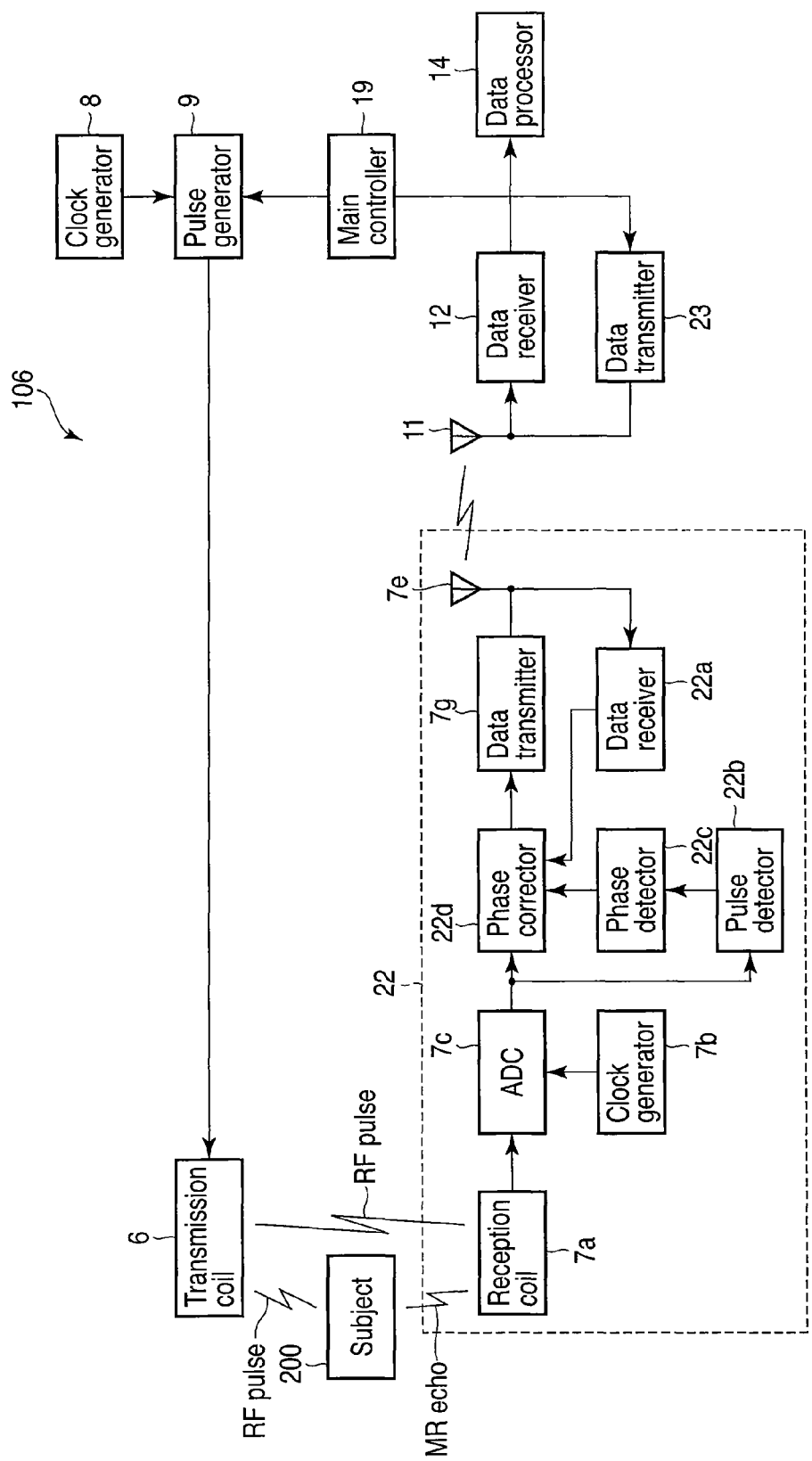
FIG. 15 is a block diagram of a coil side unit in FIG. 14.

FIG. 15 is a block diagram of the coil side unit 22. It is to be noted that in FIG. 15, the same part as that of FIG. 1 and FIG. 2 is denoted with the same reference numerals.

The coil side unit 22 comprises a reception coil 7a, a clock generator 7b, an ADC 7c, a data transmitter 7d, an antenna 7e, a data receiver 22a, an RF pulse detector 22b, a phase detector 22c and a phase corrector 22d. That is, the coil side unit 22 comprises the data receiver 22a, the RF pulse detector 22b, the phase detector 22c and the phase corrector 22d in addition to the elements of the coil side unit 7 of the first embodiment.

The data receiver 12 receives, by the antenna 7e, the signal for descending transmission wirelessly transmitted from the data transmitter 23 via the antenna 11, to extract the RF parameter from the signal for descending transmission. The data receiver 12 transfers the extracted RF parameter to the phase corrector 22d.

The RF pulse detector 22b detects the RF pulse signal from the RF signal indicated by the RF data with processing similar to that in the RF pulse detector 13a of the first embodiment.

The phase detector 22c performs processing similar to that in the phase detector 13b of the first embodiment, to detect a phase of the RF pulse detected by the RF pulse detector 22b, thereby outputting phase data indicating a phase value of the RF pulse phase.

To the phase corrector 22d, the same RF parameter as that transferred to the pulse generator 9 is transferred from the main controller 19 via the data transmitter 23, the antennas 11 and 7e and the data receiver 22a. Based on the phase indicated by the RF parameter and the phase detected by the phase detector 22c, the phase corrector 22d calculates the amount of a phase offset which occurs in the echo signal indicated by the RF data during digitization by the ADC 7c. The phase corrector 22d corrects the RF data so as to compensate for the phase offset amount calculated as described above. The RF data corrected by the phase corrector 22d is transferred to the data transmitter 7d.

In the MRI apparatus 106, the coil side unit 22 performs all the processing performed by the correction unit 13 of the MRI apparatus 101. Moreover, the processing is similar to that performed by the correction unit 13. However, the RF parameter generated by the main controller 19 needs to be transferred to the phase corrector 22d, and hence the RF parameter is wirelessly transmitted through the data transmitter 23, the antennas 11 and 7e and the data receiver 22a.

In consequence, the sixth embodiment can obtain an effect similar to that of the first embodiment.

It is to be noted that in the sixth embodiment, the system side unit does not require any data concerning the RF pulse received by the reception coil 7a. Therefore, the data transmitter 7d may generate the signal for ascending transmission including an only part of the RF data including the echo signal. In this case, the amount of the data to be wirelessly transmitted can be decreased as compared with the first embodiment. That is, a transmission rate of the data by the data transmitter 7d can be lowered as compared with the first embodiment.

However, since the sixth embodiment comprises the data receiver 22a, the RF pulse detector 22b, the phase detector 22c and the phase corrector 22d, the coil side unit 22 might be enlarged as compared with the coil side unit 7. To solve the problem, when the miniaturization of the coil side unit is achieved in preference to the lowering of the transmission rate of the data, the first embodiment is more suitable than the sixth embodiment.

Seventh Embodiment

A schematic constitution of an MRI apparatus 107 in a seventh embodiment is similar to the MRI apparatus 106 in the sixth embodiment. Moreover, the MRI apparatus 107 is different from the MRI apparatus 106 in a constitution of a coil side unit 22.

Figure 16:
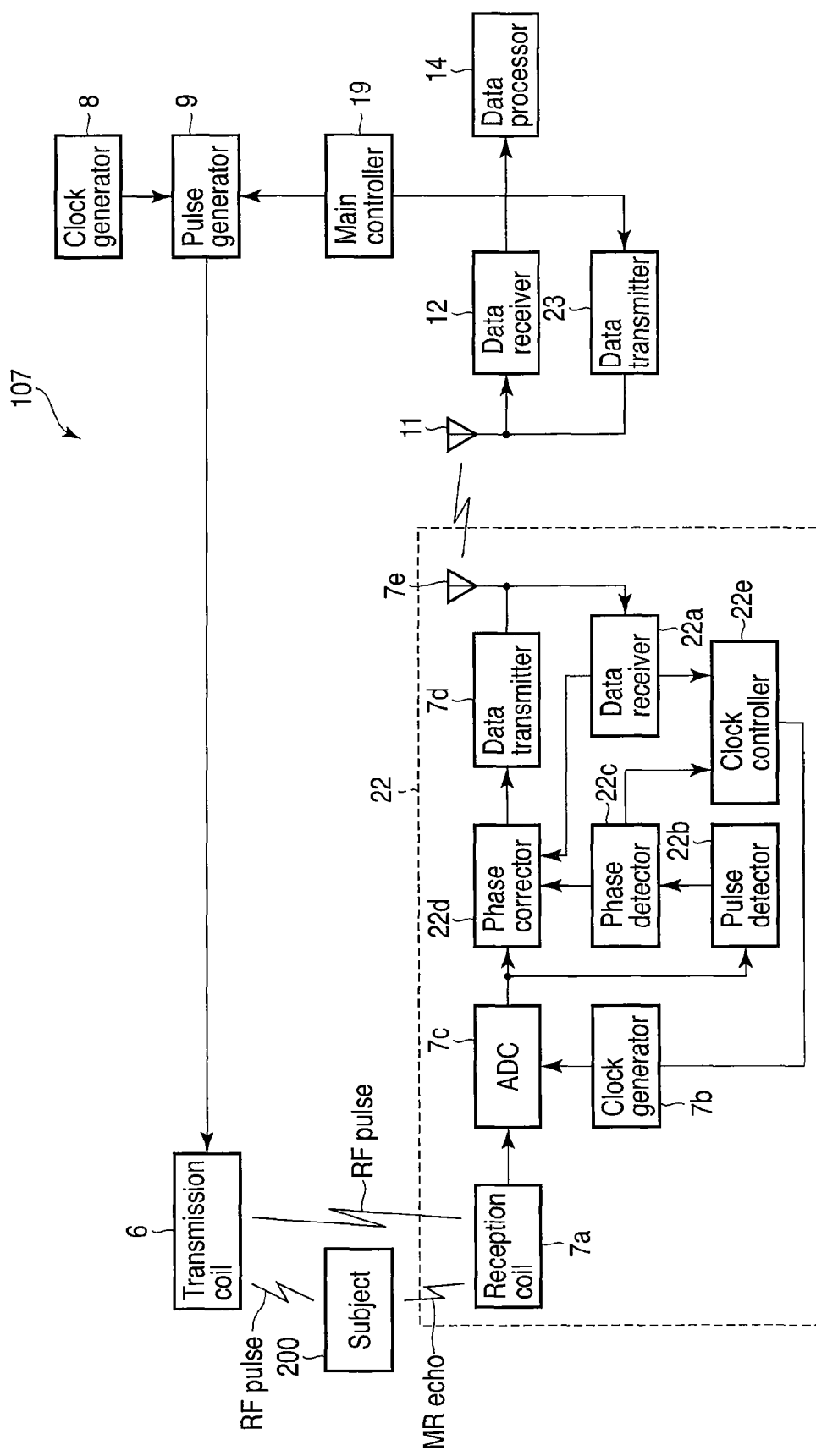
FIG. 16 is a block diagram of a coil side unit in an MRI apparatus according to a seventh embodiment.

FIG. 16 is a block diagram of the coil side unit 22. It is to be noted that in FIG. 16, the same part as that of FIG. 1, FIG. 2 and FIG. 15 is denoted with the same reference numerals.

The coil side unit 22 comprises a reception coil 7a, a clock generator 7b, an ADC 7c, a data transmitter 7d, an antenna 7e, a data receiver 22a, an RF pulse detector 22b, a phase detector 22c, a phase corrector 22d and a clock controller 22e. That is, the coil side unit 22 comprises the clock controller 22e in addition to the elements of the coil side unit 22 of the sixth embodiment.

To the clock controller 22e, the same RF parameter as that transferred to a pulse generator 9 is transferred from a main controller 19 via a data transmitter 23, an antenna 11, the antenna 7e and the data receiver 22a. The clock controller 22e obtains a time change tendency of a phase difference between a phase indicated by the RF parameter and a phase detected by the phase detector 22c, and controls the clock generator 7b so as to regulate the frequency of a second clock signal based on the tendency.

The MRI apparatus 107 corrects RF data to compensate for a phase offset which occurs in an echo signal during digitization by the ADC 7c in the same manner as in the sixth embodiment. In consequence, this seventh embodiment can obtain an effect similar to that of the first embodiment.

Furthermore, in the MRI apparatus 107, the clock controller 22e monitors the time change tendency of the phase difference between an actual RF phase detected by the phase detector 22c and a normal RF phase. Moreover, the clock controller 22e controls the clock generator 7b so as to lower the frequency of the second clock signal if the phase difference tends to increase with time and so as to raise the frequency of the second clock signal if the phase difference tends to decrease with time.

In consequence, a frequency difference between a first clock signal and the second clock signal is kept to be small, it is possible to lower a possibility that a phase offset amount of the actual RF phase with respect to the normal RF phase exceeds ±180 degrees, and it is possible to lower a possibility that indeterminacy of the phase occurs. Therefore, it is possible to raise a possibility that the phase corrector 22d can adequately perform correction.

Eighth Embodiment

A schematic constitution of an MRI apparatus 108 in an eighth embodiment is similar to the MRI apparatus 106 in the sixth embodiment. Moreover, the MRI apparatus 108 is different from the MRI apparatus 106 in a constitution of a coil side unit 22.

FIG. 17 is a block diagram of the coil side unit 22. It is to be noted that in FIG. 17, the same part as that of FIG. 1, FIG. 2 and FIG. 15 is denoted with the same reference numerals.

The coil side unit 22 comprises a reception coil 7a, a clock generator 7b, an ADC 7c, a data transmitter 7d, an antenna 7e, a data receiver 22a, an RF pulse detector 22b, a phase detector 22c and a clock controller 22e. That is, the coil side unit 22 does not comprise the phase corrector 22d among the elements of the coil side unit 22 of the sixth embodiment. Furthermore, since the correction unit 13 is not disposed, RF data output from the ADC 7c is input into the data transmitter 7d.

The MRI apparatus 108 does not correct the RF data to compensate for a phase offset which occurs in an echo signal during digitization by the ADC 7c.

However, a frequency of a second clock signal is regulated to decrease a frequency difference between a first clock signal and the second clock signal in the same manner as in the sixth embodiment.

Therefore, the frequency difference between the first clock signal and the second clock signal is kept to be small, and the phase offset which occurs in the echo signal during the digitization by the ADC 7c is also kept to be small. In consequence, it is possible to accurately reconstruct an image based on the echo signal which only has a small phase offset.

It is to be noted that in the eighth embodiment, accuracy of the reconstructed image becomes worse as compared with the first to seventh embodiments. However, since the eighth embodiment does not correct the RF data, the eighth embodiment can be realized by a simpler constitution as compared with the first to seventh embodiments.

Ninth Embodiment

A constitution of an MRI apparatus 109 in a ninth embodiment is substantially similar to the MRI apparatus 101 in the first embodiment. Moreover, the MRI apparatus 109 is different from the MRI apparatus 101 in a constitution of a phase detector 13b.

Figure 18:
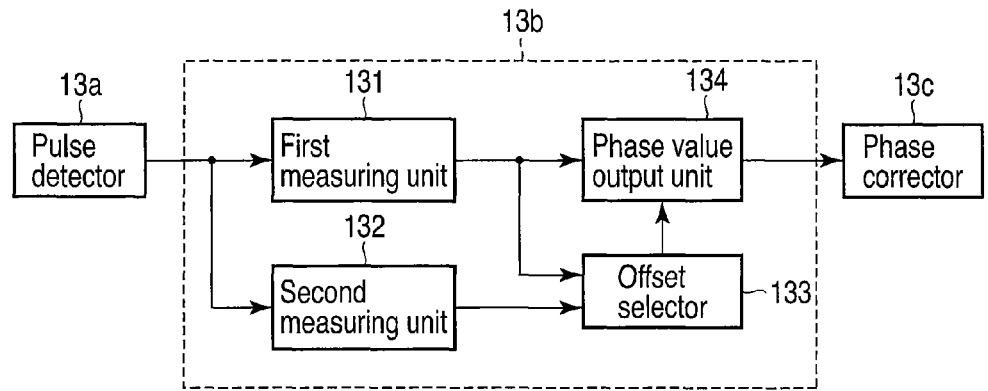
FIG. 18 is a block diagram of a main part of an MRI apparatus according to a ninth embodiment.

FIG. 18 is a block diagram of a main part of the MRI apparatus 109. It is to be noted that the same part as that of FIG. 1 and FIG. 2 is denoted with the same reference numerals, and detailed description thereof is omitted.

The phase detector 13b of the MRI apparatus 109 comprises a first measuring unit 131, a second measuring unit 132, an offset selector 133 and a phase value output unit 134.

The first measuring unit 131 measures a first phase value with a signal obtained by dividing a signal in a first section of an RF pulse signal output from an RF pulse detector 13a by an SIN C function shifted as much as offset $T_{off}$ from a normal RF phase. The first measuring unit 131 measures the first phase value concerning each of different offsets $T_{off}$.

The second measuring unit 132 measures a second phase value with a signal obtained by dividing a signal in a second section of the RF pulse signal output from the RF pulse detector 13a by the SIN C function shifted as much as the offset $T_{off}$ from the normal RF phase. The second measuring unit 132 measures the second phase value concerning each of the same offsets $T_{off}$ as those used by the first measuring unit 131.

The offset selector 133 obtains an absolute value of a difference between the first phase value and the second phase value concerning the same offset $T_{off}$ with respect to each of the offsets $T_{off}$, and selects offset $T_{off\_min}$ having a minimum difference from the plurality of offsets $T_{off}$.

The phase value output unit 134 outputs the first phase value concerning the offset $T_{off\_min}$ as the phase value of the RF pulse detected by the RF pulse detector 13a.

Next, an operation of the MRI apparatus 109 having the above constitution will be described. It is to be noted that an operation other than the operation of the phase detector 13b is similar to the operation of the MRI apparatus 101 of the first embodiment, and hence description thereof is omitted. Here, the operation of the phase detector 13b will be described in detail.

Meanwhile, as described in the first embodiment, when the frequency of the RF pulse signal is known, the phase can be calculated by correlation calculation. However, the RF pulse signal is not a signal constituted only of certain frequency components, but is a kind of modulated signal. For example, the RF pulse signal is represented by a product of the SIN C function and an SIN function. In this case, the RF pulse signal can be represented as a function of time t in Equation (1).

$$F_{RF}(t) = \sin c(2\pi \cdot t \cdot f_S) \cdot \sin(2 \cdot t \cdot f_C). \quad (1)$$

When there is not any offset between the frequency of a first clock signal and the frequency of a second clock signal, a signal obtained by sampling from Equation (1) in an ADC 7c is basically observed as the same signal among all RF pulses. On the other hand, when there is an offset between the frequency of the first clock signal and the frequency of the second clock signal, delay or advance occurs at a sampling timing in accordance with the amount of the offset. In consequence, an offset occurs between the signal obtained by sampling a certain RF pulse and a signal obtained by sampling the next RF pulse. When the sampling timing offsets by $\Delta T$, a signal sampled for a sample cycle $T_{samp}$ is represented by Equation (2).

$$\begin{aligned} F_{RF}[k] &= F_{RF}(kT_S + \Delta T) \quad (2) \\ &= \sin c(2\pi \cdot (kT_S + \Delta T) \cdot f_S) \cdot \sin(2\pi \cdot (kT_{samp} + \Delta T) \cdot f_C) \\ &= \sin c(2\pi \cdot (kT_S + \Delta T) \cdot f_S) \cdot \\ &\quad \sin(2\pi \cdot kT_{samp} \cdot f_C + 2\pi \cdot \Delta T \cdot f_C) \end{aligned}$$

In Equation (2), $2\pi \times \Delta T \times fc$ is a term of the phase offset. Therefore, when the correlation calculation of this signal with a signal having the same frequency as described above, i.e., a signal having a frequency fc is performed, the above term of the phase offset can be calculated. This is represented by Equation (3), in which angle(.) indicates an operation to calculate the phase of a vector in a case where a real part and an imaginary part of a value of one complex number are assigned to two axes of a two-dimensional plane, respectively.

$$\text{angle}\Sigma\{F_{RF-pulse}[k] \cdot e^{-j \cdot 2\pi \cdot kT_{samp} \cdot f_{center}}\} \quad (3)$$

As to the detection of the phase offset by Equation (3), when the term of the SIN C function hardly changes in a sample to perform the correlation calculation, i.e., when fs is sufficiently small, the phase offset can accurately be detected. On the other hand, when the term of the SIN C function noticeably changes in the sample to perform the correlation calculation, i.e., when fs is large, a waveform is distorted owing to the change of the SIN C function, and an error is generated in the detected phase offset value sometimes. Conversely, when the correlation calculation is performed after removing the term of the SIN C function, influence of the SIN C function can be avoided.

Figure 19:
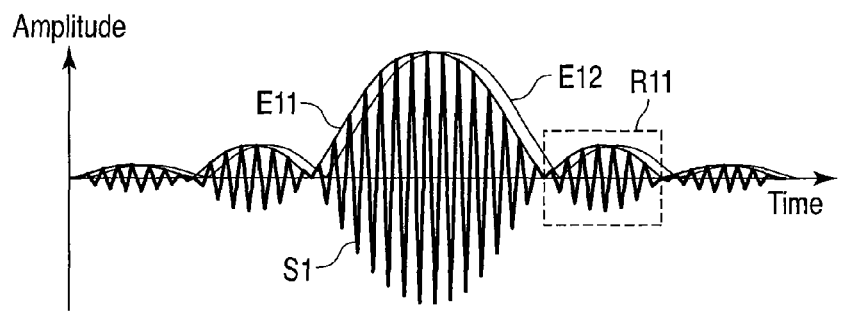
FIG. 19 is a diagram showing an example of a waveform of an RF pulse signal.

FIG. 19 is a diagram showing an example of the waveform of the RF pulse signal.

As shown in FIG. 19, the RF pulse signal is formed by modulating an amplitude of SIN signal S1 having a constant frequency with the SIN C function. Therefore, the amplitude of an envelope curve of the RF pulse signal is represented by the term of the SIN C function, and changes with time as shown by an envelope curve E11.

Figure 20:
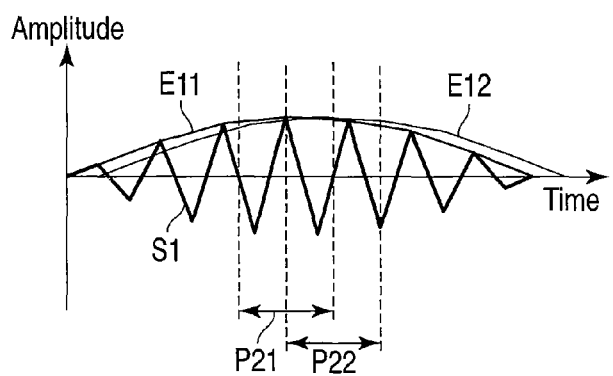
FIG. 20 is an enlarged view of a part of an RF pulse signal in FIG. 19.

FIG. 20 is an enlarged view of the RF pulse signal in a region R11 of FIG. 19.

The RF pulse signal has the envelope curve E11. Therefore, when the RF pulse signal is divided by the same function as the envelope curve E11, the amplitude of the envelope curve becomes constant, whereby a signal having a waveform shown in FIG. 21 can be obtained. On the other hand, when the RF pulse signal is divided by a function represented by an envelope curve E12 which slightly shifts from the envelope curve E11, the amplitude of the envelope curve of the signal subjected to this division does not become constant, whereby, for example, a signal having a waveform shown in FIG. 22 can be obtained.

Figure 21:
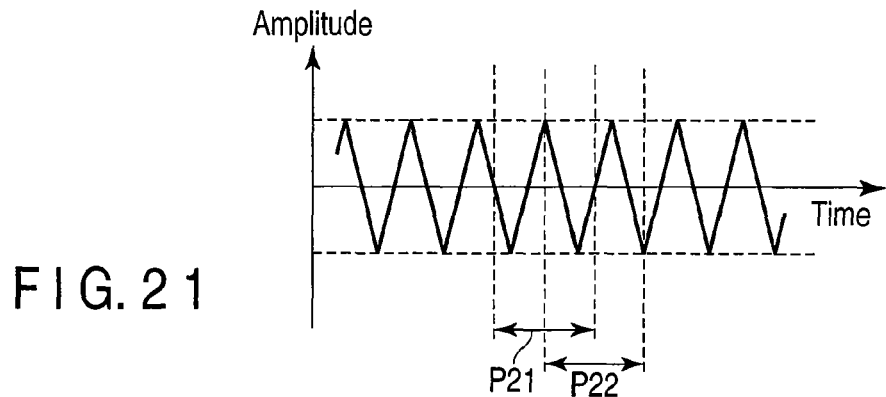
FIG. 21 is a diagram showing an example of a waveform of a detected signal.
Figure 22:
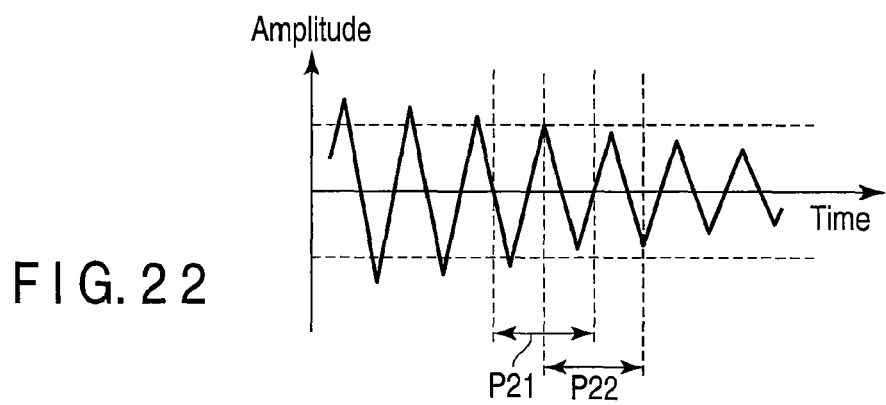
FIG. 22 is a diagram showing another example of the waveform of the detected signal.

In the signal shown in FIG. 21, the term of the SIN C function can substantially completely be removed, and based on this signal, the phase value of the RF pulse signal can accurately be measured. However, in the signal shown in FIG. 22, more than a little influence of the term of the SIN C function is left. Therefore, the above influence due to the SIN C function cannot completely be avoided, which lowers measurement accuracy of the phase value of the RF pulse signal.

In consequence, when the component of the SIN C function is removed from the RF pulse signal, timing of the SIN C function in the RF pulse signal is preferably brought as close as possible to timing of the SIN C function for use in the division. However, the phase of the RF pulse output from the RF pulse detector 13a is not known, and the timing of the component of the SIN C function is also unknown.

Here, the phase value detected by the correlation calculation from the $k_0$-th sample to the $k_0+k_w$-th sample of the RF pulse signals is represented by Equation (4) as follows, by use of a signal divided by the SIN C function having a timing which shifts from a predetermined reference timing as much as $T_{off}$.

$$p(k_0, T_{off}) = \text{angle} \sum_{k=k_0}^{k_0+k_w} \left\{ \frac{F_{RF}[k]}{\sin c(kT_S + T_{off})} \cdot e^{-j \cdot 2\pi \cdot kT_S \cdot f_C} \right\} \quad (4)$$

As apparent also from the above description, the phase value obtained by Equation (4) has the highest accuracy in a case where the offset $\Delta T$ between the timing of the component of the SIN C function in the RF pulse signal and the above reference timing is equal to $T_{off}$. Conversely, when $\Delta T$ is not equal to $T_{off}$, an error is loaded on the phase value obtained by Equation (4). Moreover, the amount or positive/negative polarity of the error changes in accordance with the distortion of the waveform of the signal received in a range in which the correlation calculation is performed. For example, when the phase value of Equation (4) is calculated concerning a section P21 and a section P22 in FIG. 20, respectively, and $\Delta T$ is equal to $T_{off}$, the phase is appropriately detected based on a signal shown in FIG. 21 in both the sections P21 and P22. Therefore, a difference between the phase values calculated in the sections P21 and P22 indicates a value which is close to 0. On the other hand, when $\Delta T$ is not equal to $T_{off}$, the phase is detected based on a signal shown in FIG. 22 in the sections P21 and P22, respectively. However, the sections P21 and P22 have different distortions of the waveforms, respectively, whereby the difference between the phase value calculated in the section P21 and the phase value calculated in the section P22 increases. In consequence, the absolute value of the difference between the phase values measured in two sections temporally shifted from each other usually tends to increase, as the absolute value of the difference between $\Delta T$ and $T_{off}$ is large.

Figure 23:
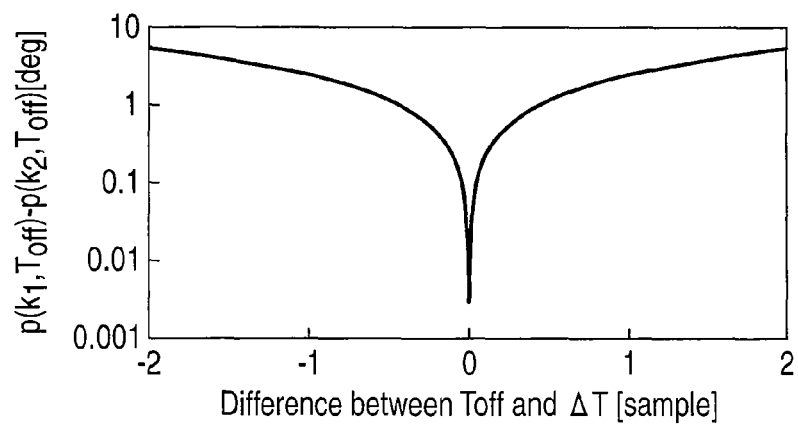
FIG. 23 is a diagram showing characteristics concerning a difference between two phase values.

FIG. 23 is a diagram showing a relation of the difference between $\Delta T$ and $T_{off}$ with respect to the absolute value of the difference between the phase values measured in the two sections. In FIG. 23, the abscissa indicates the difference between $\Delta T$ and $T_{off}$, and the ordinate indicates the absolute value of the difference between the phase values measured in two sections.

Also from FIG. 23, it is seen that as the difference between ΔT and $T_{off}$ is close to 0, the absolute value of the difference between the phase values measured in two sections rapidly decreases. When this property is used and there is checked $T_{off}$ with which the absolute value of the difference between the phase values measured in two sections becomes smallest, a value which is close to ΔT can be determined. This is represented by Equation (5) as follows.

$$t_{opt} = \underset{t}{\operatorname{argmin}} |p(k_1, t) - p(k_2, t)| \qquad (5)$$

A phase value calculated by Equation (6) using $t_{opt}$ obtained in this manner becomes an accurate phase value from which the influence of the SIN C function is efficiently cut.

$$p_{prop} = p(k_1, t_{opt}) \qquad (6)$$

To detect the phase based on the above principle, the MRI apparatus 109 calculates phase values concerning a plurality of offsets $T_{off}$ as first phase values, respectively, by Equation (4) with respect to a first section such as the section P21, and calculates phase values concerning the plurality of offsets $T_{off}$ as second phase values, respectively, by Equation (4) with respect to a second section such as the section P22.

The offset selector 133 obtains the absolute value of the difference between the first phase value and the second phase value concerning the corresponding offset $T_{off}$ among the plurality of offsets $T_{off}$. Then, the offset selector 133 selects, as $T_{off\_min}$, $T_{off}$ concerning the minimum value among a plurality of absolute values obtained as described above.

Then, the phase value output unit 134 outputs a value concerning $T_{off\_min}$ among the plurality of first phase values as the phase value of the RF pulse detected by the RF pulse detector 13a, i.e., the detection result of the phase detector 13b.

In consequence, this ninth embodiment can obtain an effect similar to that of the first embodiment.

Moreover, the ninth embodiment can accurately detect the phase of the RF pulse signal represented by the product of the SIN C function and the SIN function, whereby the amount of the phase offset which occurs in the echo signal can accurately be obtained. Therefore, it is possible to accurately compensate for the phase offset which occurs in the echo signal, and it is possible to further improve accuracy of image reconstruction.

It is to be noted that the constitution of the phase detector in this ninth embodiment can be applied to the phase detectors 13b, 7i, 20b and 22c in the second to eighth embodiments.

From this embodiment, various modifications can be implemented as follows.

(1) The phase of the RF pulse signal can be detected by using a timing at which the waveform of the RF pulse signal exceeds a certain threshold value. This principle will be described with reference to FIG. 24 and FIG. 25.

When the frequency of the second clock signal shifts from the frequency of the first clock signal, in accordance with the amount of the shift, delay or advance occurs in a timing to sample the RF pulse signal. In consequence, when the RF pulse signal detected from RF data is superimposed onto the RF pulse signal generated by a pulse generator 9, an offset occurs in the timing and is observed as shown in FIG. 24. Here, when a threshold value is set to 0, a timing at which one RF pulse signal S11 exceeds the threshold value of 0 is a timing T21, and a timing at which the other RF pulse signal S12 exceeds 0 is a timing T22. A time difference D1 which is a difference between the two timings T21 and T22 is divided by a cycle of the RF pulse signal, i.e., the inverse number of the frequency of the RF pulse signal, and is further multiplied by 2π, thereby obtaining a value of a phase difference between the RF pulse signals S11 and S12.

However, the RF pulse signal in the RF data is represented by a discrete sampling value, and hence a timing at which the level of the RF pulse signal reaches the threshold value cannot directly be obtained from the RF data. Therefore, as shown in FIG. 25, when two consecutive samples have values which are below and above the threshold value, respectively, the values are interpolated, whereby a timing at which the waveform exceeds the threshold value may be estimated. However, in this case, the interpolation is incompletely performed, and hence an error occurs in the detection result of the phase. In the example of FIG. 25, an actual time difference is D11, whereas the time difference measured by use of the interpolation is D12. In general, as the sampling frequency is higher with respect to the frequency of the RF pulse signal, i.e., the variance speed of the waveform, the waveform after the sampling is more finely represented. Therefore, the accuracy of the above interpolation improves, and the error which occurs in the phase detection result becomes small. Therefore, when the phase is detected by utilizing the present modification example, the sampling frequency is preferably high. Conversely, it can be considered that when the sampling frequency is high, the present modification example is suitably applied.

(2) When the transmission coil unit 6 emits the RF pulse and the sensitivity of the reception coil 7a is set to such a high level that the MR echo can sufficiently be received, the RF pulse emitted from the transmission coil unit 6 is absorbed by the reception coil 7a, whereby the efficiency of spin excitation in the subject 200 lowers sometimes. As a countermeasure against this problem, decoupling is performed sometimes. The decoupling temporarily lowers the sensitivity of the reception coil 7a.

When this decoupling is performed, the SN ratio of the RF echo signal obtained by the reception coil 7a noticeably deteriorates, and the accuracy of the phase detection of the RF echo signal might lower. To solve the problem, in each of the above first to ninth embodiments, the RF pulse signal to be transferred to the ADC 7c may be obtained by using an antenna 24 which is disposed separately from the reception coil 7a as shown in FIG. 26.

However, in this case, the antenna 24 is preferably disposed away from the subject 200 as compared with the reception coil 7a.

(3) In the first to ninth embodiments, the first clock signal generated by the clock generator 8 is wirelessly transmitted to the coil side unit, and the clock generator 7b may generate the second clock signal synchronously with this wirelessly transmitted first clock signal.

FIG. 27 is a diagram showing a constitution example for wirelessly transmitting the first clock signal.

In the example shown in FIG. 27, a clock transmitter 25, antennas 26 and 27 and a clock receiver 28 are additionally disposed, and the first clock signal output from the clock generator 8 is wirelessly transmitted through the clock transmitter 25, the antennas 26 and 27 and the clock receiver 28, and input into the clock generator 7b.

When the second clock signal is generated synchronously with the first clock signal in this manner, it is possible to lower a probability that a phase offset of the second clock signal with respect to the first clock signal becomes large to such an extent that indeterminacy occurs. Therefore, it is possible to stably realize compensation for the phase offset of the echo signal.

It is to be noted that when the RF parameter is wirelessly transmitted, this RF parameter may be multiplexed with the first clock signal and be wirelessly transmitted. In this case, the data transmitter 21 or the data transmitter 23 and the clock transmitter 25 are replaced with a transmitter which wirelessly transmits a transmission signal obtained by multiplexing the RF parameter with the first clock signal. Any of the data receivers 20a, 20d and 22a and the clock receiver 28 are replaced with a receiver which separates the RF parameter and the first clock signal from the above transmission signal.

(4) When the first detection processing example is applied to the phase detector 7i of the fifth embodiment and the phase detector 22c of the sixth to eighth embodiments, the data receivers 20a and 22a transfer the RF parameters to the phase detectors. Moreover, when the first detection processing example is applied to the phase detector 7i of the third embodiment, for example, elements corresponding to the data transmitter 21 and the data receiver 20a in the fourth embodiment are added, and the RF parameters are transferred from the main controller 19 to the phase detector 7i via these elements.

(5) When the fourth detection processing example is applied to the phase detectors 7i, 20b and 22c, the phase detectors 7i, 20b and 22c need to know the frequency of the RF pulse signal. Therefore, in this case, the data receivers 20a and 20d transfer the RF parameter to the phase detectors 7i, 20b and 22c, and the phase detectors 7i, 20b and 22c determine the frequency of the RF pulse signal based on this RF parameter. However, in the third embodiment, the RF parameter cannot be transferred from the system side unit to the coil side unit 7. Therefore, when the fourth detection processing example is applied to the phase detector 7i of the third embodiment, the data transmitter 21 and the data receiver 20a of the fourth embodiment are additionally disposed.

(6) In the second embodiment and the fourth embodiment, among the RF pulse signals, the only signal in a section which is not saturated as in the section P12 shown in FIG. 5 is preferably transmitted. When a signal of a saturated section is not transmitted in this manner, the sending of useless data can be avoided, whereby the data rate of the data transmitter 7g can efficiently be lowered.

(7) When both the phase correction of the echo signal and the frequency regulation of the second clock signal are performed as in the fourth, fifth and seventh embodiments, the RF pulse detectors and the phase detectors may individually be disposed in both the system side unit and the coil side unit. In consequence, it is not necessary to transmit the RF pulse data and the phase data from/to the system side unit to/from the coil side unit.

(8) The main controller 19 does not have to notify the respective units of all the RF parameters, and may notify the units of the only parameter which becomes a material for judging necessary information such as the normal RF phase, the frequency of the RF pulse signal or the like.

(9) An analog circuit for regulating the RF signal may be interposed between the reception coil 7a and the ADC 7c. For example, an amplifier for regulating a gain, a filter for limiting a band, a mixer for converting a frequency or the like may be interposed. When the RF pulse signal is obtained by the antenna 24 as shown in FIG. 26, the signal received by the reception coil 7a and the signal received by the antenna 24 may be synthesized before these analog circuits. In this case, the echo signal and the RF pulse signal are regulated in the same manner, and hence a phase relation is easily stored.

(10) A digital circuit which processes the RF data to regulate the RE signal may be disposed in a stage after the ADC 7c. For example, a digital gain regulation circuit which regulates a gain, a digital filter which limits a band, a digital mixer which converts a frequency or the like may be interposed. In this type of processing, the RF pulse signal and the echo signal may be processed in the same manner. In this case, the echo signal and the RF pulse signal are regulated in this manner, and hence a phase relation is easily stored. Moreover, when the RF pulse signal and the echo signal are subjected to different types of processing, all the RF pulse signals may be subjected to the same processing, or all the echo signals may be subjected to the same processing. In this case, a phase relation between the RF pulse signals and a phase relation between the echo signals become relatively constant, and hence the phase is easily detected and corrected.

(11) The correction value which has been set once may be utilized to compensate for the phase offset among a plurality of echo signals. For example, as a preparatory operation before the start of the imaging, the correction value is set, and the correction value may be utilized until the imaging ends.

(12) According to the first to third correction processing examples, the phase of the echo signal can be corrected so that the phase comes close to the original phase. However, a timing to detect the actual RF phase does not necessarily match a timing to obtain the normal RF phase, and hence it is difficult to completely match the phase of the echo signal with the original phase. Moreover, a timing at which the actual RF phase is detected in one RF pulse might change among a plurality of RF pulses, respectively. Furthermore, the corrected phases of the plurality of echo signals might vary owing to such a timing change.

The above respects are taken into consideration to modify the first correction processing example as follows, to obtain a fourth correction processing example which can be applied.

First, when all the RF pulses included in the RF signal have the same waveform, the actual RF phase detected by the phase detector 13b has a value which indicates the offset amount of the phase with respect to a constant reference phase. Therefore, when the actual RF phase is multiplied by a constant coefficient to set the correction value, the phases of the plurality of echo signals can be matched with a constant phase. However, the reference phase is irrelevant to the normal RF phase, and a phase difference between the reference phase and the normal RF phase cannot be recognized by the phase corrector 13c. Therefore, the phases of the plurality of echo signals are not matched with the original phase. However, when the phases of the plurality of echo signals match one another, it is possible to accurately reconstruct an image, and the correction of this fourth correction processing example is also effective.

Specifically, the above coefficient is, for example, −1. In this case, the phase corrector 13c obtains a correction value having the same absolute value as that of the actual RF phase and a different direction. That is, when the actual RF phase is −20 degrees, the phase corrector 13c sets the correction value to +20 degrees. Moreover, the phase corrector 13c applies the correction value set in this manner until the actual RF phase is next detected, and corrects the RF data so as to change the phase as much as the correction value.

Figure 28:
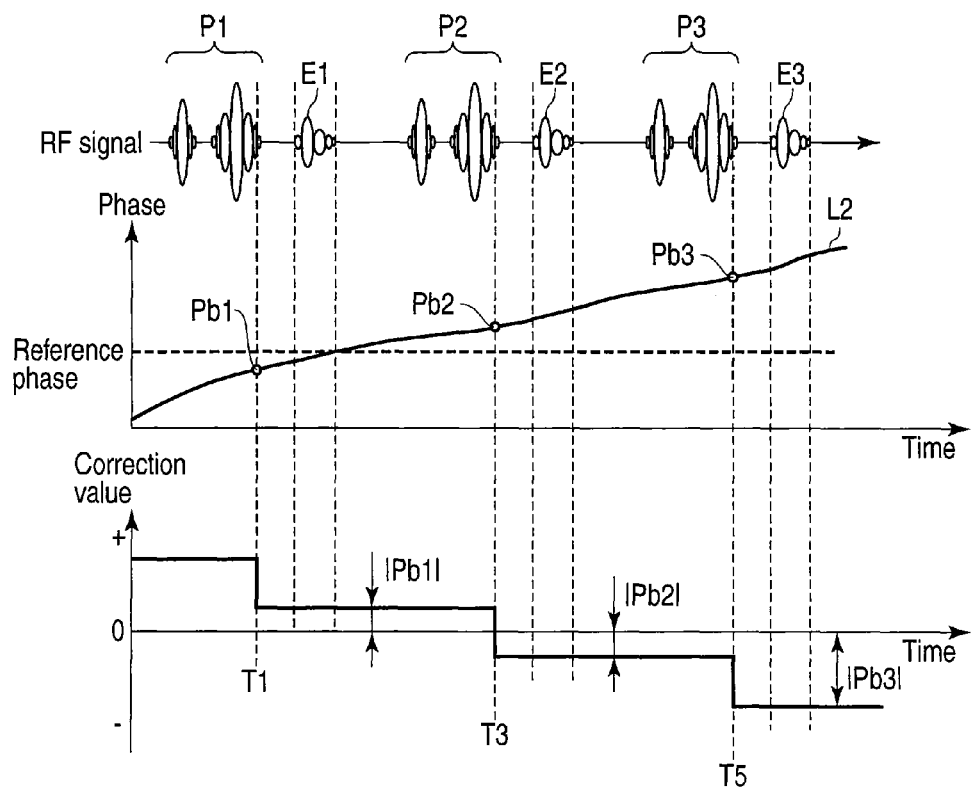
FIG. 28 is a diagram showing an example of change of a correction value set in a fourth correction processing example.

FIG. 28 is a diagram showing an example of change of the correction value set in the fourth correction processing example. In FIG. 28, it is assumed that the normal RF phase and the actual RF phase have time change characteristics shown in FIG. 3.

In this case, an actual RF phase Pb1 detected at a timing T1 is negative. Therefore, the phase corrector 13c sets the correction value to the absolute value of Pb1 till a timing T3 at which the actual RF phase is next detected.

An actual RF phase Pb2 detected at the timing T3 is positive. Therefore, the phase corrector 13*c* sets the correction value to −Pb2 till a timing T5 at which the actual RF phase is next detected.

In consequence, such processing can uniformly set the phases of echo signals E1, E2, E3, . . . around a reference phase, respectively.

Meanwhile, the pulse generator 9 changes the phase of the RF pulse sometimes depending on a pulse sequence for use. In this case, the change of the actual RF phase with time includes the above phase change amount of the RF pulse, and hence the correction value set as described above includes this phase change amount. To solve the problem, when the phase of the RF pulse generated by the pulse generator 9 is changed, the phase corrector 13*c* obtains the phase change amount of the RF pulse based on the RF parameter, corrects the actual RF phase so as to subtract the phase change amount from the correction value, and then sets the correction value based on the corrected actual RF phase as described above.

It is to be noted that the modification added to the first correction processing example in the above fourth correction processing example is similarly added to the second correction processing example and the third correction processing example, respectively, to obtain a fifth correction processing example and a sixth correction processing example which can be applied.

FIG. 29 is a diagram showing an example of change of the correction value set in the fifth correction processing example. FIG. 30 is a diagram showing an example of change of the correction value set in the sixth correction processing example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a first clock generator which generates a first clock signal;
a pulse generator which generates an excitation pulse signal based on the first clock signal;
a transmission coil which wirelessly transmits an excitation pulse based on the excitation pulse signal;
a reception coil which receives the excitation pulse wirelessly transmitted from the transmission coil and a magnetic resonance echo emitted from a subject by a function of the excitation pulse to obtain a radio frequency signal;
a second clock generator which generates a second clock signal;
a digital converter which digitizes, synchronously with the second clock signal, the radio frequency signal or signal obtained by subjecting the radio frequency signal to predetermined processing, to obtain radio frequency data;
a pulse detector which detects excitation pulse data corresponding to the excitation pulse from the radio frequency data;
a phase detector which detects a phase of a pulse indicated by the excitation pulse data detected by the pulse detector; and
a corrector which calculates an amount of a phase shift which occurs in the magnetic resonance echo indicated by the radio frequency data during the digitization in the digital converter, based on the excitation pulse data and the phase detected by the phase detector and which corrects the radio frequency data so as to compensate for the amount of the phase shift.

2. The apparatus of claim 1, further comprising:
an adjuster which adjusts a frequency of the second clock signal based on change with time of the phase detected by the phase detector.

3. The apparatus of claim 1, further comprising:
a second phase detector which detects the phase of the pulse indicated by the excitation pulse data detected by the pulse detector; and
an adjuster which regulates a frequency of the second clock signal based on change with time of the phase detected by the second phase detector.

4. A magnetic resonance imaging apparatus comprising:
a first clock generator which generates a first clock signal;
a pulse generator which generates an excitation pulse signal based on the first clock signal;
a transmission coil which wirelessly transmits an excitation pulse based on the excitation pulse signal;
a reception coil which receives the excitation pulse wirelessly transmitted from the transmission coil and a magnetic resonance echo emitted from a subject by a function of the excitation pulse to obtain a radio frequency signal;
a second clock generator which generates a second clock signal;
a digital converter which digitizes, synchronously with the second clock signal, the radio frequency signal or signal obtained by subjecting the radio frequency signal to predetermined processing, to obtain radio frequency data;
a pulse detector which detects excitation pulse data corresponding to the excitation pulse from the radio frequency data;
a phase detector which detects a phase of a pulse indicated by the excitation pulse data detected by the pulse detector;
an adjuster which adjusts a frequency of the second clock signal based on change with time of the phase detected by the phase detector; and
a corrector which calculates an amount of a phase shift which occurs in the magnetic resonance echo indicated by the radio frequency data during the digitization in the digital converter, based on the excitation pulse data and the phase detected by the phase detector and which corrects the radio frequency data so as to compensate for the amount of the phase shift.

5. A magnetic resonance imaging apparatus comprising:
a first clock generator which generates a first clock signal;
a pulse generator which generates an excitation pulse signal based on the first clock signal;
a transmission coil which wirelessly transmits an excitation pulse based on the excitation pulse signal;
an antenna which outputs a radio frequency signal corresponding to the excitation pulse wirelessly transmitted from the transmission coil;
a reception coil which outputs a radio frequency signal corresponding to magnetic resonance echo emitted from a subject by a function of the excitation pulse;

a second clock generator which generates a second clock signal;

a digital converter which digitizes, synchronously with the second clock signal, the radio frequency signals output from the antenna and the reception coil or signals obtained by subjecting the radio frequency signals to predetermined processing, to obtain radio frequency data;

a pulse detector which detects excitation pulse data corresponding to the excitation pulse from the radio frequency data;

a phase detector which detects a phase of a pulse indicated by the excitation pulse data detected by the pulse detector; and a corrector which calculates an amount of a phase shift which occurs in the magnetic resonance echo indicated by the radio frequency data during the digitization in the digital converter, based on the excitation pulse data and the phase detected by the phase detector and which corrects the radio frequency data so as to compensate for the amount of the phase shift.

6. The apparatus of claim 5, further comprising:
an adjuster which adjusts a frequency of the second clock signal based on change with time of the phase detected by the phase detector.

7. The apparatus of claim 5, further comprising:
a second phase detector which detects the phase of the pulse indicated by the excitation pulse data detected by the pulse detector; and
an adjuster which adjusts a frequency of the second clock signal based on change with time of the phase detected by the second phase detector.

8. A magnetic resonance imaging apparatus comprising:
a first clock generator which generates a first clock signal;
a pulse generator which generates an excitation pulse signal based on the first clock signal;
a transmission coil which wirelessly transmits an excitation pulse based on the excitation pulse signal;
an antenna which outputs a radio frequency signal corresponding to the excitation pulse wirelessly transmitted from the transmission coil;
a reception coil which outputs a radio frequency signal corresponding to magnetic resonance echo emitted from a subject by a function of the excitation pulse;
a second clock generator which generates a second clock signal;
a digital converter which digitizes, synchronously with the second clock signal, the radio frequency signals output from the antenna and the reception coil or signals obtained by subjecting the radio frequency signals to predetermined processing, to obtain radio frequency data;
a pulse detector which detects excitation pulse data corresponding to the excitation pulse from the radio frequency data;
a phase detector which detects a phase of a pulse indicated by the excitation pulse data detected by the pulse detector;
an adjuster which adjusts a frequency of the second clock signal based on change with time of the phase detected by the phase detector; and
a corrector which calculates an amount of a phase shift which occurs in the magnetic resonance echo indicated by the radio frequency data during the digitization in the digital converter, based on the excitation pulse data and the phase detected by the phase detector and which corrects the radio frequency data so as to compensate for the amount of the phase shift.

9. The apparatus of claim 1, including a system side unit and a coil side unit,
wherein the system side unit comprises the first clock generator, the pulse generator, the transmission coil, the pulse detector, the phase detector and the corrector,
the coil side unit comprises the reception coil, the second clock generator and the digital converter,
the coil side unit further comprises a wireless transmitter which wirelessly transmits the radio frequency data,
the system side unit further comprises a wireless receiver which receives the radio frequency data wirelessly transmitted from the wireless transmitter,
the pulse detector detects excitation pulse data corresponding to the excitation pulse from the radio frequency data received by the wireless receiver, and
the corrector corrects the radio frequency data received by the wireless receiver.

10. The apparatus of claim 1, including a system side unit and a coil side unit,
wherein the system side unit comprises the first clock generator, the pulse generator, the transmission coil, the phase detector and the corrector,
the coil side unit comprises the reception coil, the second clock generator, the digital converter and the pulse detector,
the coil side unit further comprises a wireless transmitter which wirelessly transmits the radio frequency data and excitation pulse data detected by the pulse detector,
the system side unit further comprises a wireless receiver which receives the radio frequency data and the excitation pulse data wirelessly transmitted from the wireless transmitter,
the phase detector detects the phase of the pulse indicated by the excitation pulse data received by the wireless receiver, and
the corrector corrects the radio frequency data received by the wireless receiver.

11. The apparatus of claim 1, including a system side unit and a coil side unit,
wherein the system side unit comprises the first clock generator, the pulse generator, the transmission coil and the corrector,
the coil side unit comprises the reception coil, the second clock generator, the digital converter, the pulse detector and the phase detector,
the coil side unit further comprises a wireless transmitter which wirelessly transmits the radio frequency data and phase data which indicates the phase detected by the phase detector,
the system side unit further comprises a wireless receiver which receives the radio frequency data and the phase data wirelessly transmitted from the wireless transmitter, and
the corrector corrects the radio frequency data received by the wireless receiver based on a phase indicated by the phase data received by the wireless receiver.

12. The apparatus of claim 1, including a system side unit and a coil side unit,
wherein the system side unit comprises the first clock generator, the pulse generator and the transmission coil,
the coil side unit comprises the reception coil, the second clock generator, the digital converter, the pulse detector, the phase detector and the corrector, the coil side unit further comprises a wireless transmitter which wirelessly transmits radio frequency data corrected by the corrector, and the system side unit further comprises a wireless receiver which receives the radio frequency data wirelessly transmitted from the wireless transmitter.

13. The apparatus of claim 1, further comprising:
a clock transmitter which wirelessly transmits the first clock signal; and
a clock receiver which receives the first clock signal wirelessly transmitted from the clock transmitter,
wherein the second clock generator generates the second clock signal synchronously with the first clock signal received by the clock receiver.

14. The apparatus of claim 1, further comprising:
a setting unit which sets a timing at which the pulse generator generates the excitation pulse signal,
wherein the pulse detector detects the excitation pulse data based on the timing set by the setting unit.

15. The apparatus of claim 1, wherein the pulse detector detects a time point at which a signal level indicated by the radio frequency data is not less than a predetermined level, as a start time point of the excitation pulse data.

16. The apparatus of claim 1, wherein the digital converter has a saturation level which is smaller than the maximum level of an output signal of the reception coil corresponding to the excitation pulse and which is larger than the maximum level of the output signal of the reception coil corresponding to the magnetic resonance echo, and
the pulse detector detects a time point at which a signal level indicated by the radio frequency data becomes the saturation level, as a start time point of the excitation pulse data.

17. The apparatus of claim 1, wherein the digital converter has a saturation level which is smaller than the maximum level of an output signal of the reception coil corresponding to the excitation pulse and which is larger than the maximum level of the output signal of the reception coil corresponding to the magnetic resonance echo, and
the pulse detector detects, as the excitation pulse data, output data of the digital converter after a signal level indicated by the radio frequency data changes from the saturation level to a level which is lower than the saturation level.

18. The apparatus of claim 1, wherein the phase detector calculates a correlation between a part of a signal waveform indicated by the excitation pulse data detected by the pulse detector and a signal including the same frequency component as that of the excitation pulse generated by the pulse generator, to detect the phase of the pulse indicated by the excitation pulse data.

19. The apparatus of claim 1, wherein the pulse generator generates the excitation pulse signal as a signal having an amplitude variance represented by a function obtained as a product of a first function and a second function, and
the phase detector further comprises:
a first phase value calculator which divides, by the second function provided with offsets having different offset amounts, a signal in a first section as a part of the pulse indicated by the excitation pulse data detected by the pulse detector, respectively, to obtain a plurality of third functions, and calculates a correlation between each of the third functions and the first function, to calculate a plurality of first phase values corresponding to the plurality of offset amounts, respectively;
a second phase value calculator which respectively divides, by the second function provided with the offsets having the plurality of offset amounts, a signal in a second section, different from the first section, as a part of the pulse indicated by the excitation pulse data detected by the pulse detector, to obtain a plurality of fourth functions, and calculates a correlation between each of the fourth functions and the first function, to calculate a plurality of second phase values corresponding to the plurality of offset amounts, respectively;
a phase difference calculator which calculates a plurality of phase differences corresponding to the plurality of offset amounts as a difference between the first phase value and the second phase value corresponding to the same offset amount;
a selector which selects the phase of the pulse indicated by the excitation pulse data detected by the pulse detector as the first phase value calculated by the first phase value calculator or the second phase value calculated by the second phase value calculator concerning the offset amount corresponding to the minimum phase difference among the plurality of phase differences calculated by the phase difference calculator.

20. The apparatus of claim 1, wherein the phase detector obtains a timing at which a signal level of the pulse indicated by the excitation pulse data detected by the pulse detector reaches the threshold value, by interpolation processing based on two signal levels concerning two consecutive samples of signal levels indicated by the excitation pulse data detected by the pulse detector, one signal level being below the threshold value and the other signal level being above the threshold value, to detect, as the timing, the phase of the pulse indicated by the excitation pulse data detected by the pulse detector.

* * * * *